(12) United States Patent
Wang et al.

(10) Patent No.: US 11,815,627 B2
(45) Date of Patent: Nov. 14, 2023

(54) MIRROR ASSEMBLY FOR LIGHT STEERING WITH REDUCED FINGER THICKNESS

(71) Applicant: Beijing Voyager Technology Co., Ltd., Beijing (CN)

(72) Inventors: Youmin Wang, Mountain View, CA (US); Yufeng Wang, Mountain View, CA (US); Qin Zhou, Livermore, CA (US); Gary Li, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 553 days.

(21) Appl. No.: 16/905,254

(22) Filed: Jun. 18, 2020

(65) Prior Publication Data
US 2021/0396850 A1    Dec. 23, 2021

(51) Int. Cl.
*G01S 7/481*     (2006.01)
*B81B 3/00*     (2006.01)
(Continued)

(52) U.S. Cl.
CPC ............ *G01S 7/4812* (2013.01); *B81B 3/004* (2013.01); *B81B 3/0021* (2013.01);
(Continued)

(58) Field of Classification Search
CPC ........ B81B 2201/042; B81B 2201/033; B81B 2203/0136; B81B 3/0021; B81B 3/004; B81B 2203/0172; B81B 2203/058; B81B 3/0045; G01S 17/88–931; G02B 26/0833–0858; G02B 26/0825; G02B 26/0841; G02B 26/101; B81C 1/00134
See application file for complete search history.

(56) References Cited

U.S. PATENT DOCUMENTS

| | | | |
|---|---|---|---|
| 7,538,927 B1 * | 5/2009 | Fu | ............... G02B 26/0841 216/2 |
| 7,567,367 B2 | 7/2009 | Ji | |

(Continued)

OTHER PUBLICATIONS

U.S. Appl. No. 16/905,248, "Non-Final Office Action", dated Apr. 21, 2023, 19 pages.

*Primary Examiner* — Shahed Ahmed
*Assistant Examiner* — Sun Mi Kim King
(74) *Attorney, Agent, or Firm* — Kilpatrick Townsend & Stockton LLP

(57) ABSTRACT

In one example, an apparatus that is part of a Light Detection and Ranging (LiDAR) module of a vehicle comprises a semiconductor integrated circuit comprising a microelectromechanical system (MEMS) and a substrate. The MEMS comprises an array of micro-mirror assemblies, each micro-mirror assembly comprising: a micro-mirror having a first thickness; and an actuator comprising first fingers and second fingers, the first fingers being connected with the substrate, the second fingers being mechanically connected to the micro-mirror having a second thickness smaller than the first thickness, the actuator being configured to generate an electrostatic force between the first fingers and the second fingers to rotate the micro-mirror to reflect light emitted by a light source out of the LiDAR module or light received by the LiDAR module to a receiver.

11 Claims, 22 Drawing Sheets

(51) Int. Cl.
*G01S 17/931* (2020.01)
*B81C 1/00* (2006.01)
*G02B 1/11* (2015.01)

(52) U.S. Cl.
CPC ...... *B81C 1/00134* (2013.01); *B81C 1/00523* (2013.01); *G01S 17/931* (2020.01); *G02B 1/11* (2013.01); *B81B 2201/042* (2013.01)

(56) References Cited

U.S. PATENT DOCUMENTS

| | | |
|---|---|---|
| 8,879,132 B2 | 11/2014 | Naono |
| 2001/0022682 A1 | 9/2001 | McClelland et al. |
| 2003/0090172 A1* | 5/2003 | Lee ................ B81B 3/004 310/309 |
| 2009/0296181 A1* | 12/2009 | Omori ................ G02B 26/101 359/224.1 |
| 2010/0067084 A1* | 3/2010 | Hagihara ............ G02B 26/101 216/2 |
| 2012/0236379 A1 | 9/2012 | Da Silva et al. |
| 2014/0062506 A1 | 3/2014 | Defazio et al. |
| 2016/0096477 A1* | 4/2016 | Biemer ................ H04N 23/60 348/148 |
| 2018/0113200 A1 | 4/2018 | Steinberg et al. |
| 2019/0018233 A1* | 1/2019 | Fu ..................... G02B 26/0841 |

* cited by examiner

MIRROR ASSEMBLY FOR LIGHT STEERING WITH REDUCED FINGER THICKNESS

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc.

Light steering can be performed in both transmission and reception of light. For example, a light steering transmitter may include a micro-mirror array to control the projection direction of light to detect/image an object. Moreover, a light steering receiver may also include a micro-mirror array to select a direction of incident light to be detected by the receiver, to avoid detecting other unwanted signals. The micro-mirror array may include an array of micro-mirror assemblies, with each micro-mirror assembly comprising a micro-mirror and an actuator. In a micro-mirror assembly, a mirror-mirror can be mechanically connected to a substrate. As used herein, "mechanically connected", or "connected", can include a direct connection or an indirect connection. For example, the micro-mirror can be indirectly connected to the substrate via a connection structure (e.g., a torsion bar, a spring, etc.) to form a pivot/connection point.

A micro-mirror can be rotated around the pivot/connection point by an actuator. Each micro-mirror can be rotated by a rotation angle to reflect (and steer) light towards a target direction. The connection structure can be deformed to accommodate the rotation, but the connection structure also has a degree of spring stiffness which varies with the rotation angle to counter the rotation of the micro-mirror to set a target rotation angle. To rotate a micro-mirror by a target rotation angle, an actuator can apply, to the micro-mirror, a torque based on the moment of inertia of the mirror, as well as the degree of spring stiffness for a given target rotation angle. Different torques can be applied to the micro-mirror to achieve different target rotation angles.

To simplify the control of the micro-mirror, it is desirable to have the required torque to be substantially linear across the entire range of rotation angle. This allows the torque to be substantially linear to the target rotation angle. Moreover, it is also desirable to reduce the moment of inertia of the micro-mirror to reduce the torque required to rotate the micro-mirror as well as the degree of spring stiffness of the connection structures needed to maintain the structural integrity of the pivot point, as high spring stiffness can increase the non-linearity of the required torque with respect to rotation angle.

BRIEF SUMMARY

In some embodiments, an apparatus is provided. The apparatus is part of a Light Detection and Ranging (LiDAR) module of a vehicle and comprises: a semiconductor integrated circuit comprising a microelectromechanical system (MEMS) and a substrate, the MEMS comprising an array of micro-mirror assemblies, each micro-mirror assembly comprising: a micro-mirror having a first thickness; and an actuator comprising first fingers and second fingers, the first fingers being directly connected with the substrate, the second fingers being mechanically connected to the micro-mirror having a second thickness smaller than the first thickness, the actuator being configured to generate an electrostatic force between the first fingers and the second fingers to rotate the micro-mirror to reflect light emitted by a light source out of the LiDAR module or to reflect light received by the LiDAR module to a receiver.

In some aspects, the second fingers are mechanically and directly connected to the micro-mirror and formed along two opposite edges of the micro-mirror and interleave with the first fingers.

In some aspects, the second fingers are mechanically connected to the micro-mirror via one or more frames that surround the micro-mirror. The one or more frames comprise a first frame. The second fingers are formed along two opposite edges of the first frame and interleave with the first fingers.

In some aspects, the first frame is connected to the substrate via a first pair of connection structures aligned with a rotation axis, the first frame being rotatable around the rotation axis relative to the substrate, the first pair of connection structures being connected to the substrate and the first frame at first pivot points aligned with the rotation axis and being elastic, the first pair of connection structures being deformable to accommodate the rotation of the first frame with respect to the substrate. The first frame is connected to the micro-mirror via a second pair of connection structures aligned along the rotation axis, the micro-mirror rotatable around the rotation axis relative to the first frame and relative to the substrate, the second pair of connection structures being connected to the first frame and the micro-mirror at second pivot points aligned with the rotation axis and being elastic and deformable to accommodate the rotation of the micro-mirror with respect to the first frame.

In some aspects, the first pair of connection structures and the second pair of connection structures comprise at least one of: a spring or a torsion bar.

In some aspects, when the first frame rotates by a first angle relative to the substrate, the micro-mirror rotates by a second angle relative to the substrate, a magnitude of the second angle being larger than the first angle.

In some aspects, a ratio between the second angle and the first angle is pre-determined based on a first degree of stiffness of the first pair of connection structures, a second degree of stiffness of the second pair of connection structures, a first moment of inertia of the first frame, and a second moment of inertia of the micro-mirror.

In some aspects, the one or more frames comprises the first frame and a second frame. The first frame surrounds the second frame and the second frame surrounds the micro-mirror. The first frame is connected to the second frame via the second pair of connection structures. The second frame and the micro-mirror is connected via third connection structures. The second frame and the micro-mirror rotate together relative to the first frame.

In some aspects, the micro-mirror comprises a first side and a second side opposite to the second side. The first side comprises a light reflecting surface. The second side comprises a plurality of ridge structures, the plurality of ridge structures having the first thickness and configured to increase a stiffness of the micro-mirror. In some aspects, the plurality of ridge structures intersect and form compartments on the second side of the micro-mirror.

In some aspects, the substrate comprises a first silicon layer, a second silicon layer, and an insulator layer sandwiched between the first silicon layer and the second silicon layer. The micro-mirror, the first fingers, and the second fingers are formed in the first silicon layer. The plurality of ridge structures are formed in the second silicon layer.

In some aspects, the light source is a laser source. In some aspects, the apparatus further comprises a controller configured to control the actuator of each micro-mirror assembly of the array of micro-mirror assemblies to rotate the micro-mirror of the respective micro-mirror assembly to set one of: an input path of light to the receiver, or an output projection path of light from the light source.

In some aspects, the apparatus further comprises the light source and the receiver. The light source is a pulsed light source. The controller is configured to: control the light source to generate a first light pulse at a first time; control the actuator to set a first angle of the output projection path to project the first light pulse towards an object along the output projection path; control the actuator to set a second angle of the input path to steer a second light pulse reflected from the object to the receiver, the second light pulse being received at the receiver at a second time; and determine a location of the object with respect to the apparatus based on a difference between the first time and the second time, the first angle, and the second angle.

In some embodiments, a method of manufacturing a micro-mirror assembly is provided. The method comprises: performing a first etching operation on a back side of a silicon-on-insulator (SOI) wafer comprising a first silicon layer, a second silicon layer, and an insulator layer sandwiched between the first silicon layer and the second silicon layer to form a plurality of ridge structures in the insulator layer and in the second silicon layer; performing a second etching operation of a second wafer to form a walled structure including sidewalls surrounding a cavity; bonding the back side of the SOI wafer on the walled structure to form a stack; performing a third etching operation on a front side of the SOI wafer to pattern the first silicon layer, the insulator layer, and the second silicon layer into first fingers, second fingers, and the micro-mirror, such that the second fingers are mechanically connected to the micro-mirror and the first fingers and the second fingers are separated by a gap. The micro-mirror is rotatable in the cavity based on an electrostatic force between the first fingers and the second fingers. In some aspects, the second etching operation comprises a through-wafer operation.

In some aspects, the method further comprises: forming an insulator layer on the sidewalls and bonding the insulator layer of the sidewalls to one or more of the plurality of ridge structures on the back side of the SOI wafer via a thermal bonding process.

In some aspects, the method further comprises depositing a layer of reflective material on a first region of the front side of the SOI wafer, the first region corresponding to the micro-mirror.

In some aspects, the method further comprises depositing a layer of anti-reflection (AR) material on second regions of the front side of the SOI wafer, the second regions corresponding to the first fingers and the second fingers.

In some aspects, the second regions also correspond to one or more frames surrounding the micro-mirror. The third etching operation also patterns the first silicon layer, the insulator layer, and the second silicon layer into the one or more frames.

BRIEF DESCRIPTION OF THE DRAWINGS

The detailed description is set forth with reference to the accompanying figures.

DETAILED DESCRIPTION

Figure 1:
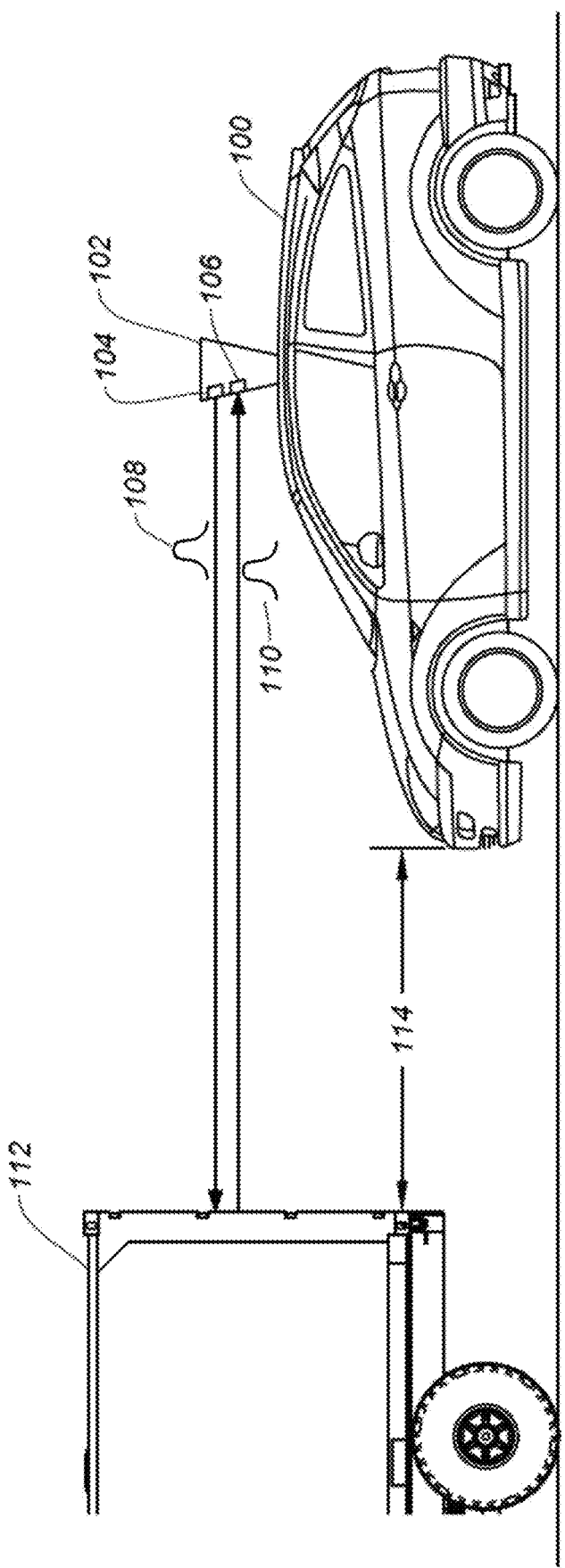
FIG. 1 shows an autonomous driving vehicle utilizing aspects of certain examples of the disclosed techniques herein.

In the following description, various examples of a mirror assembly and a light steering transmitter system will be described. For purposes of explanation, specific configurations and details are set forth in order to provide a thorough understanding of the examples. However, it will be apparent to one skilled in the art that certain examples may be practiced or implemented without every detail disclosed. Furthermore, well-known features may be omitted or simplified in order to prevent any obfuscation of the novel features described herein.

Light steering can be found in different applications. For example, a Light Detection and Ranging (LiDAR) module of a vehicle may include a light steering system. The light steering system can be part of the transmitter to steer light towards different directions to detect obstacles around the vehicle and to determine the distances between the obstacles and the vehicle, which can be used for autonomous driving. Moreover, a light steering receiver may also include a micro-mirror array to select a direction of incident light to be detected by the receiver, to avoid detecting other unwanted signals. Further, the head light of a manually-driven vehicle can include the light steering transmitter, which can be controlled to focus light towards a particular direction to improve visibility for the driver. In another example, optical diagnostic equipment, such as an endoscope, can include a light steering transmitter to steer light in different directions onto an object in a sequential scanning process to obtain an image of the object for diagnosis.

Light steering can be implemented by way of a micro-mirror array. The micro-mirror array can have an array of micro-mirror assemblies, with each micro-mirror assembly having a movable micro-mirror and an actuator (or multiple actuators). The micro-mirrors and actuators can be formed as microelectromechanical systems (MEMS) on a semiconductor substrate which allows integration of the MEMS with other circuitries (e.g., controller, interface circuits, etc.) on the semiconductor substrate. In a micro-mirror assembly, a mirror-mirror can be connected to the semiconductor substrate via a connection structure (e.g., a torsion bar, a spring, etc.) to form a pivot/connection point.

A micro-mirror can be rotated around the pivot/connection point by an actuator. Each micro-mirror can be rotated by a rotation angle to reflect (and steer) light towards a target direction. The connection structure can be deformed to accommodate the rotation, but the connection structure also has a degree of spring stiffness, which varies with the rotation angle and counters the rotation of the micro-mirror to set a target rotation angle. To rotate a micro-mirror by a target rotation angle, an actuator can apply, to the micro-mirror, a torque based on the moment of inertia of the mirror, as well as the degree of spring stiffness for a given target rotation angle. Different torques can be applied to the micro-mirror to achieve different target rotation angles. The actuator can then remove the torque, and the connection structure can return the micro-mirror back to its default orientation for the next rotation. The rotation of the micro-mirror can be repeated in the form of an oscillation at a resonant frequency based on the spring constant and the mass of the micro-mirror.

The array of micro-mirrors can receive incident light beam, and each micro-mirror can be rotated at a common rotation angle to project/steer the incident light beam at a target direction. Each micro-mirror can be rotated around two orthogonal axes to provide a first range of angles of projection along a vertical dimension and to provide a second range of angles of projection along a horizontal dimension. The first range and the second range of angles of projection can define a two-dimensional field of view (FOV) in which light is to be projected to detect/scan an object. The FOV can also define a two-dimensional range of directions of incident lights, reflected by the object, that are to be detected by the receiver.

Moreover, the frequency at which the micro-mirror rotates can define the time it takes for each micro-mirror to sweep through the ranges of angles of projection, which can affect the resolution of the scanning operation. A higher resolution of the scanning operation can be achieved by increasing the rotation frequency of the micro-mirrors. The frequency of rotation can be affected by the degree of stiffness (also known as spring constant) of the connection structure between the micro-mirror and the substrate. With a higher spring stiffness, the connection structure can return the micro-mirror back to its default orientation faster, which can increase the frequency of rotation of the micro-mirror as well as the scanning resolution.

Improvement in the FOV and detection range, as well as improvement in the resolution of the scanning operation, may lead to an increase in the overall spring stiffness of the connection structure between the micro-mirror and the substrate. Specifically, to increase the FOV and/or the detection range, the size of a micro-mirror can be increased to provide a larger aperture. The increase in the size of the micro-mirror can lead to increase in the moment of inertia of the micro-mirror. This may require the connection structure to have a higher spring stiffness to improve the structural integrity of the pivot point, otherwise the connection structure may break due to the repeated rotation of the micro-mirror. Moreover, to increase the resolution of the scanning operation, the rotation frequency of the micro-mirror can be increased, which can be achieved by increasing the spring stiffness of the connection structures to bring the micro-mirror back to its default position at a higher rate.

Increasing the overall spring stiffness of the connection structures, however, can increase the non-linearity of required torque with respect to rotation angle. For example, the degree of spring stiffness can increase at a much higher rate at a relatively large rotation angle than at a relatively small rotation angle, which means a disproportionately large torque is needed to achieve a large target rotation angle. This makes the micro-mirror more difficult to control and may increase the complexity of the control algorithm. Therefore, it is desirable to reduce the non-linearity to simplify the control of the micro-mirror. Moreover, it is also desirable to reduce the moment of inertia of a large aperture micro-mirror to reduce the overall degree of spring stiffness of the connection structures, to further reduce the non-linearity and improve control of micro-mirror.

Conceptual Overview of Certain Examples

Examples of the present disclosure relate to a light steering system that can address the problems described above. Various examples of the light steering can include a plurality of micro-mirrors to perform light steering, such as those shown and described below with respect to FIG. 2A-FIG. 7B. The light steering system can be used as part of a transmitter to control a direction of projection of output light. The light steering system can also be used as part of a receiver to select a direction of input light to be detected by the receiver. The light steering system can also be used in a coaxial configuration such that the light steering system can project output light to a location and detect light reflected from that location.

In some examples, a light steering system may include a light source, a semiconductor integrated circuit comprising a microelectromechanical systems (MEMS) and a controller, and a receiver. The MEMS may include an array of micro-mirror assemblies, each micro-mirror assembly comprising a micro-mirror. The micro-mirror assemblies of the MEMS may be configured to reflect light from the light source along an output projection path. The micro-mirror assemblies of the MEMS may also be configured to reflect incident light propagating along an input path to the receiver. In each micro-mirror assembly, the micro-mirror is rotatable around to a pivot/connection point according to a rotation angle to reflect (and steer) light towards a target direction in the field of view (FOV). Each micro-mirror assembly further includes an actuator controllable by a controller to rotate the micro-mirror.

In some examples, each micro-mirror assembly comprises a first flexible support structure and a second flexible support structure. Each micro-mirror comprises a first connection structure and a second connection structure. The first connection structure of the micro-mirror is connected to the first flexible support structure at a first pivot/connection point, whereas the second connection structure of the micro-mirror is connected to the second flexible support structure at the second pivot/connection point. The first pivot point and the second pivot point can form a rotation axis above which the micro-mirror rotates. The first and second connection structures (e.g., in the shape of a torsion bar, a spring, etc.) are elastic and have a pre-determined degree of spring stiffness to accommodate the rotation of the micro-mirror when the actuator applies a torque, and to return the micro-mirror back to its default orientation when the torque is removed. In some examples, the connection structures, the flexible support structures, and the micro-mirror can be made of silicon material.

In addition, the first flexible support structure and the second flexible support structure are connected to the substrate, either directly or via other support structures. The flexible support structures can suspend the micro-mirror in the free space above the substrate, which allows the micro-mirror to rotate. Moreover, both flexible support structures are also elastic and allow the first pivot point and the second pivot point to move when the micro-mirror rotates. Specifically, when the micro-mirror rotates from a default orientation, the first and second connection structures can have shearing deformation towards the micro-mirror. Both the first and second flexible support structures can bend to allow the first and second pivot points to move towards the micro-mirror to reduce the shearing deformation.

With the disclosed techniques, the connection structures are connected to elastic/flexible support structures which allow the pivot points to move, the sheer deformation in the connection structures can be reduced for a given rotation angle compared with a case where the connection structures are connected to fixed connection points (e.g., be connected directly to the substrate). As sheer deformation increases the degree of spring stiffness in the connection structure, the spring stiffness is no longer constant, and the required torque may become non-linear with respect to rotation angle. Reducing the sheer deformation can reduce the non-linearity, which allows the required torque to be substantially proportional to the target rotation angle across a wide range of rotation angles. The control of the micro-mirror can be simplified as a result.

Figure 3A:
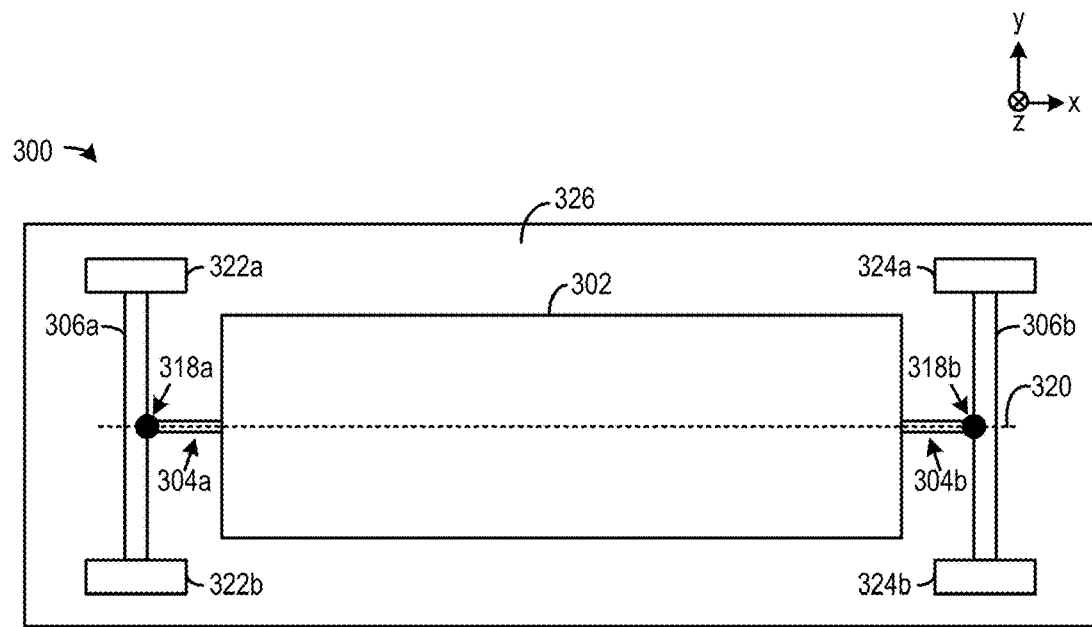
FIG. 3A, FIG. 3B, and FIG. 3C illustrate examples of a micro-mirror assembly including an elastic support structure and their operations, according to examples of the present disclosure.
Figure 3A:
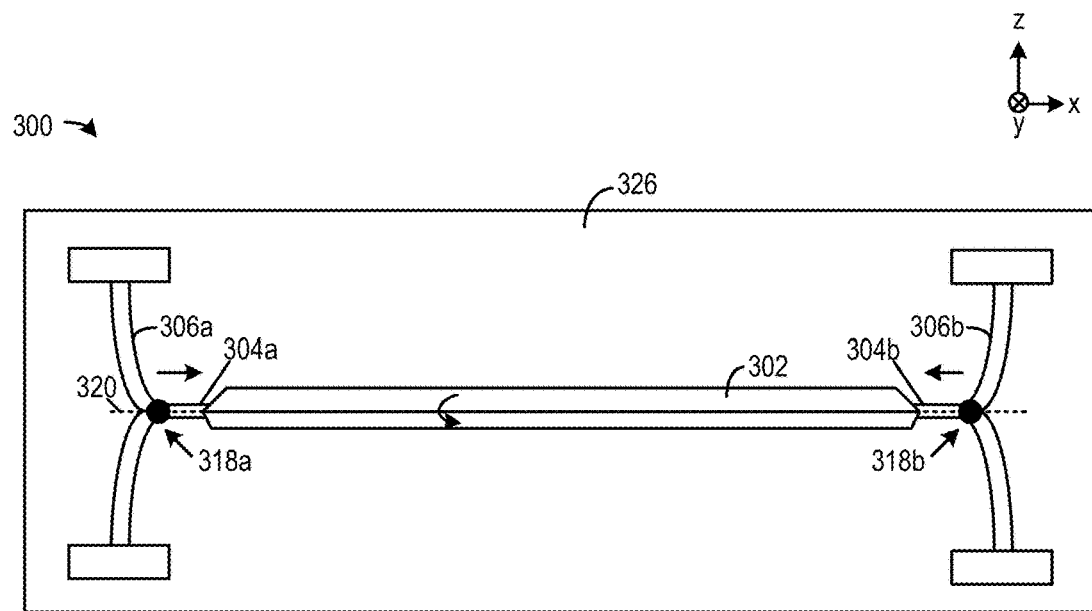
Figure 3B:
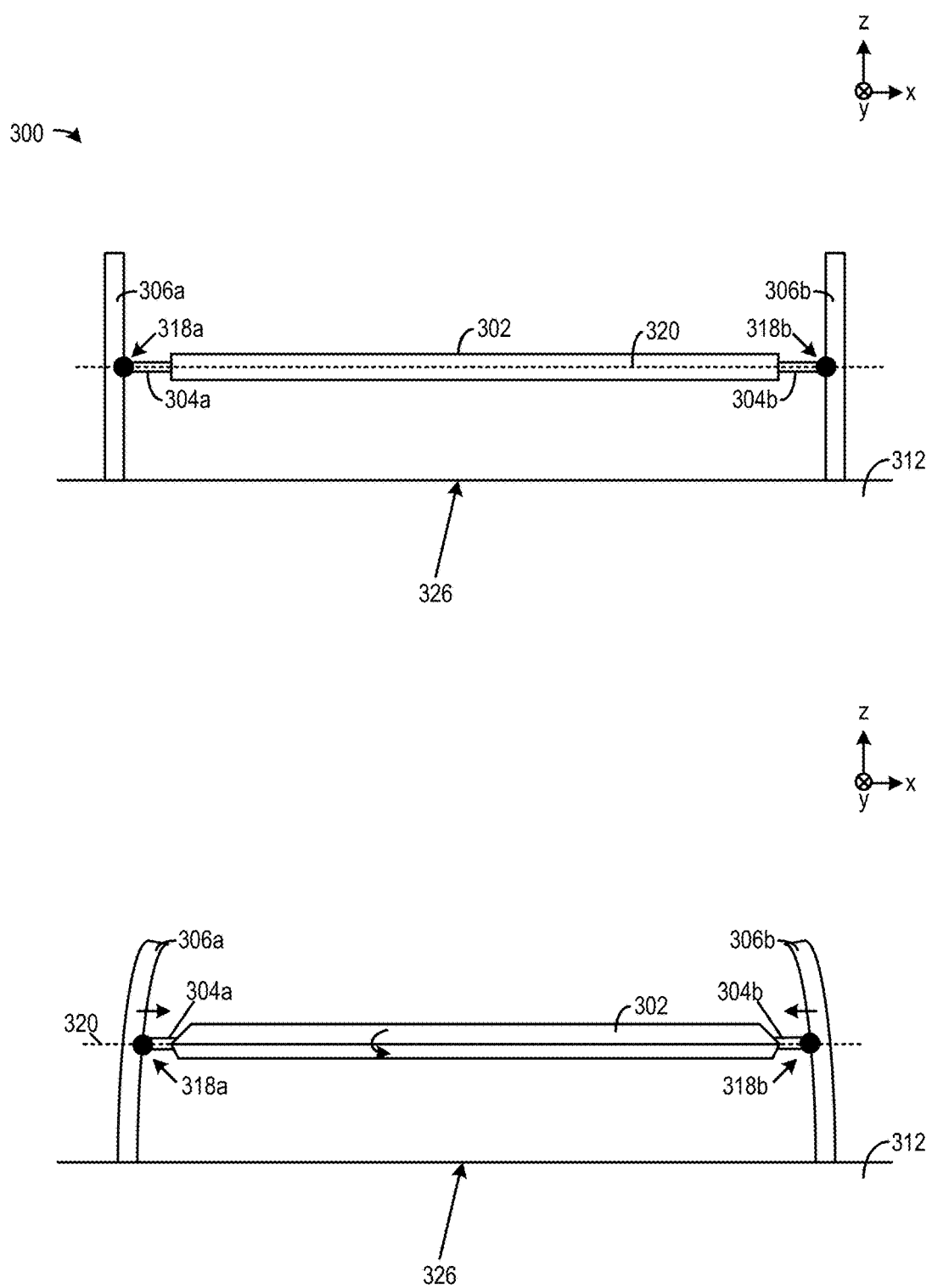
Figure 3C:
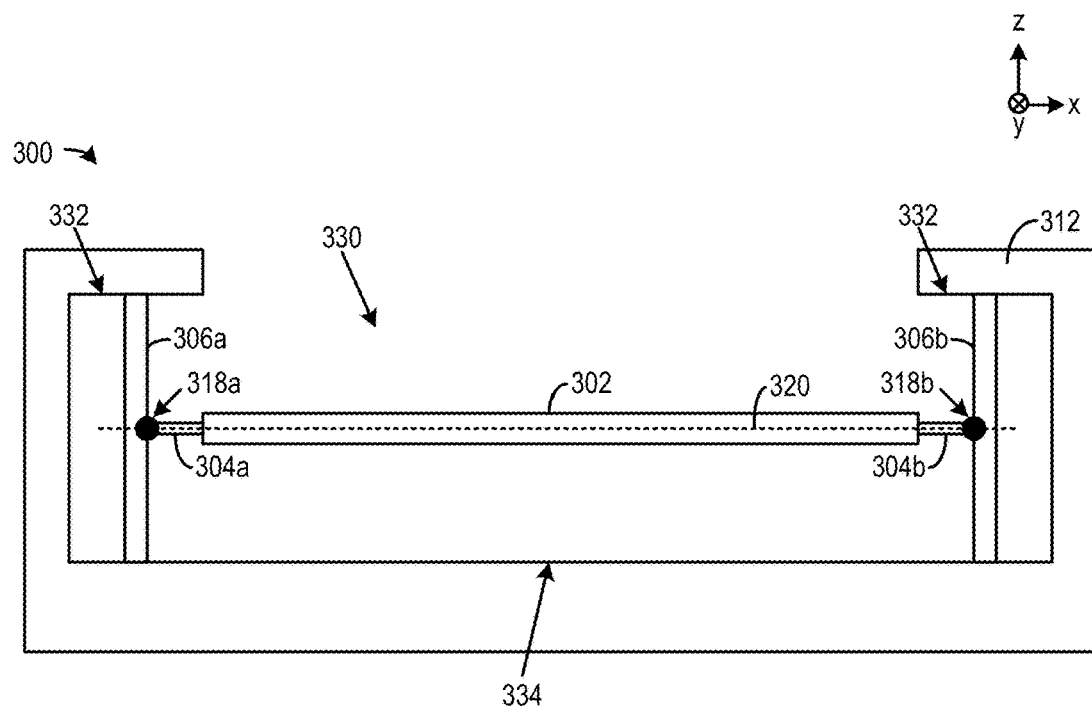
Figure 3C:
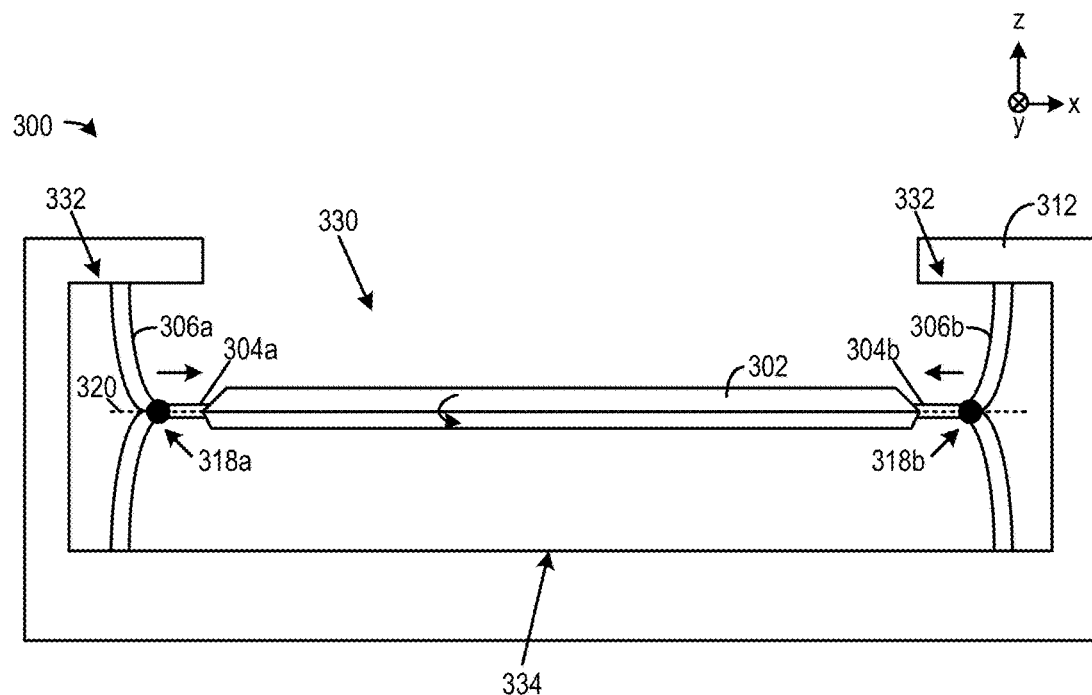

Various examples of placement of the flexible support structures are disclosed. In one example, as shown in FIG. 3A, the first flexible support structure can be connected to a first pair of rigid support structures, whereas the second flexible support structure can be connected to a second pair of rigid support structures. The first and second pairs of rigid structures can be erected on a surface of the substrate to suspend the first and second flexible support structures, as well as the connection structures and the micro-mirror. In another example, as shown in FIG. 3B, the first and second flexible support structures can be erected on and directly connected to the surface of the substrate. In yet another example, as shown in FIG. 3C, the substrate comprises an array of cavities, with each cavity housing a micro-mirror assembly of the array of micro-mirror assemblies. Each cavity comprises a ceiling portion and a bottom portion. Both the first and second flexible support structures can be sandwiched between the ceiling portion and the bottom portion of the cavity. In all these examples, one or more portions of each of the first and second flexible support structures are connected to the substrate (e.g., the bottom and ceiling portions, the substrate surface, etc.) at fixed points to set the position of the micro-mirror, while the other portions of the first and second flexible support structures can bend to accommodate the rotation of the micro-mirror.

Figure 4A:
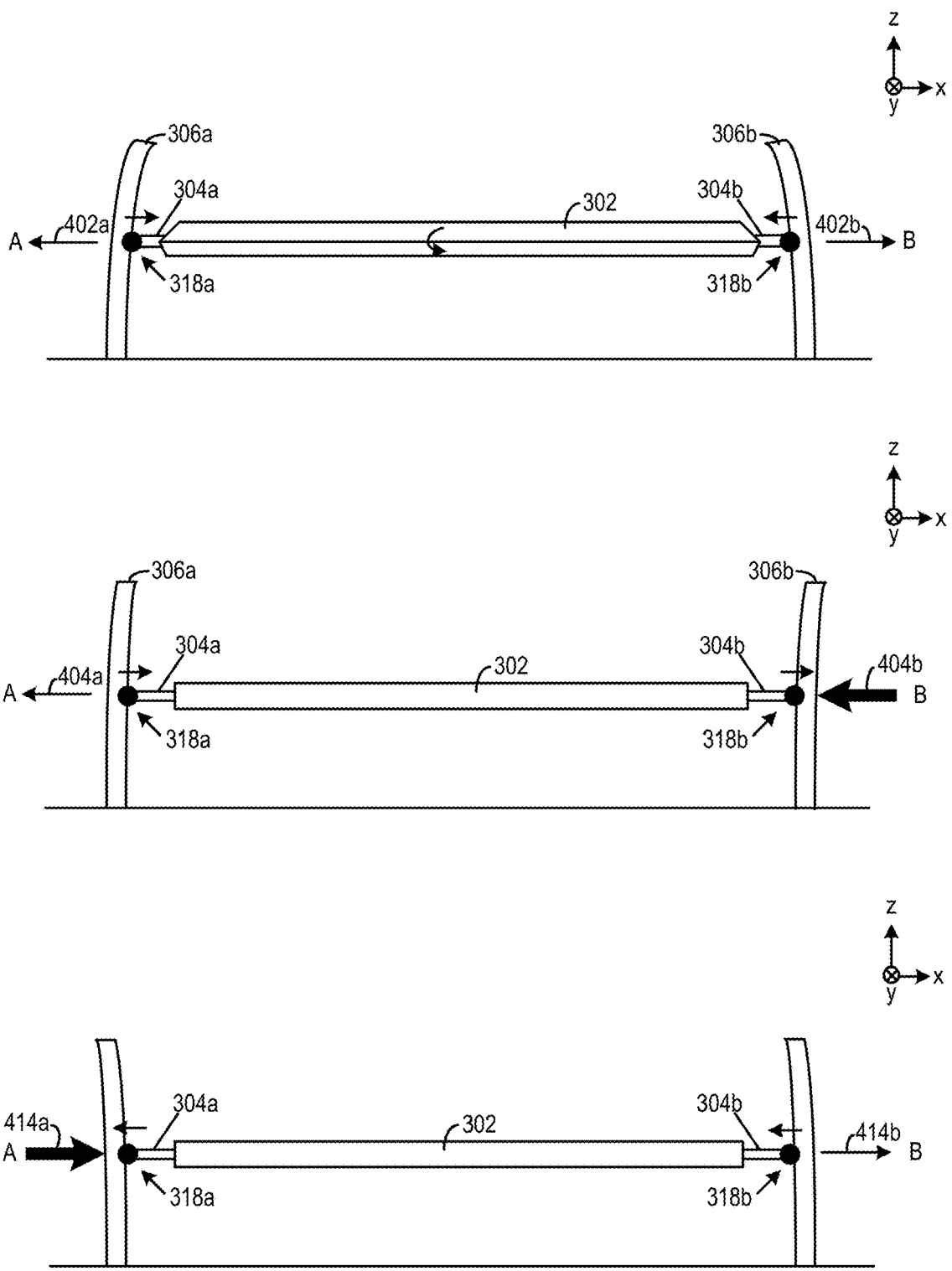
FIG. 4A, FIG. 4B, FIG. 4C, and FIG. 4D illustrate additional examples of a micro-mirror assembly of FIG. 3A-FIG. 3C and their operations, according to examples of the present disclosure.
Figure 4B:
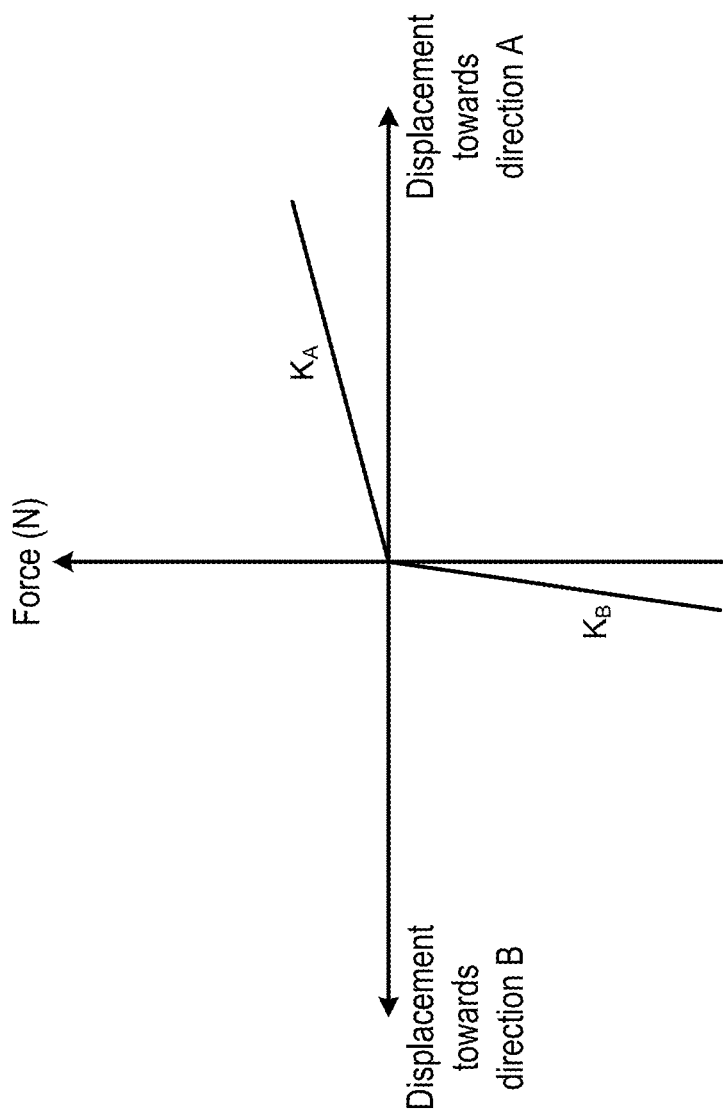

In some examples, as shown in FIG. 4A and FIG. 4B, the flexible support structures can be configured to provide different resistive forces for different directions of movement of the pivot points. For example, the flexible support structures can provide a smaller resistive force when the pivot points move towards the micro-mirror as the micro-mirror rotates. On the other hand, the flexible support structures can provide a larger resistive force when the pivot points move away from the micro-mirror. Such arrangements can reduce or prevent unwanted translational movement of the micro-mirror caused by an external force experienced by the LiDAR system such as shocks, vibrations, etc., as the vehicle moves, while facilitating the rotational movement of the micro-mirror. Reducing the translation movement of the micro-mirrors is essential, as such movement can disturb the scanning operation and change the projection paths of light reflected by the micro-mirrors, which can reduce the FOV or otherwise introduce errors in the object detection/measurement operations.

In some examples, the configuration of the flexible support structures to provide different resistive forces for different directions of movement of the pivot points can be based on having different spring constants for different directions of movement. The different spring constants can be achieved based on, for example, a non-symmetric geometric shape, different materials, etc. For example, each flexible support structure can include a convex side and a concave side. The flexible support structure can provide a larger resistive force when the movement is towards a first direction facing the convex side, while a smaller resistive force is provided when the movement is towards a second direction facing the concave side. The connection structures can connect between the concave sides of the flexible support structures and the micro-mirror, to provide smaller resistive forces to a movement of the pivot point towards the micro-mirror (caused by the rotation of the micro-mirror), and to provide larger resistive forces to a movement of the pivot point away from the micro-mirror (not caused by the rotation of the micro-mirror).

Figure 4C:
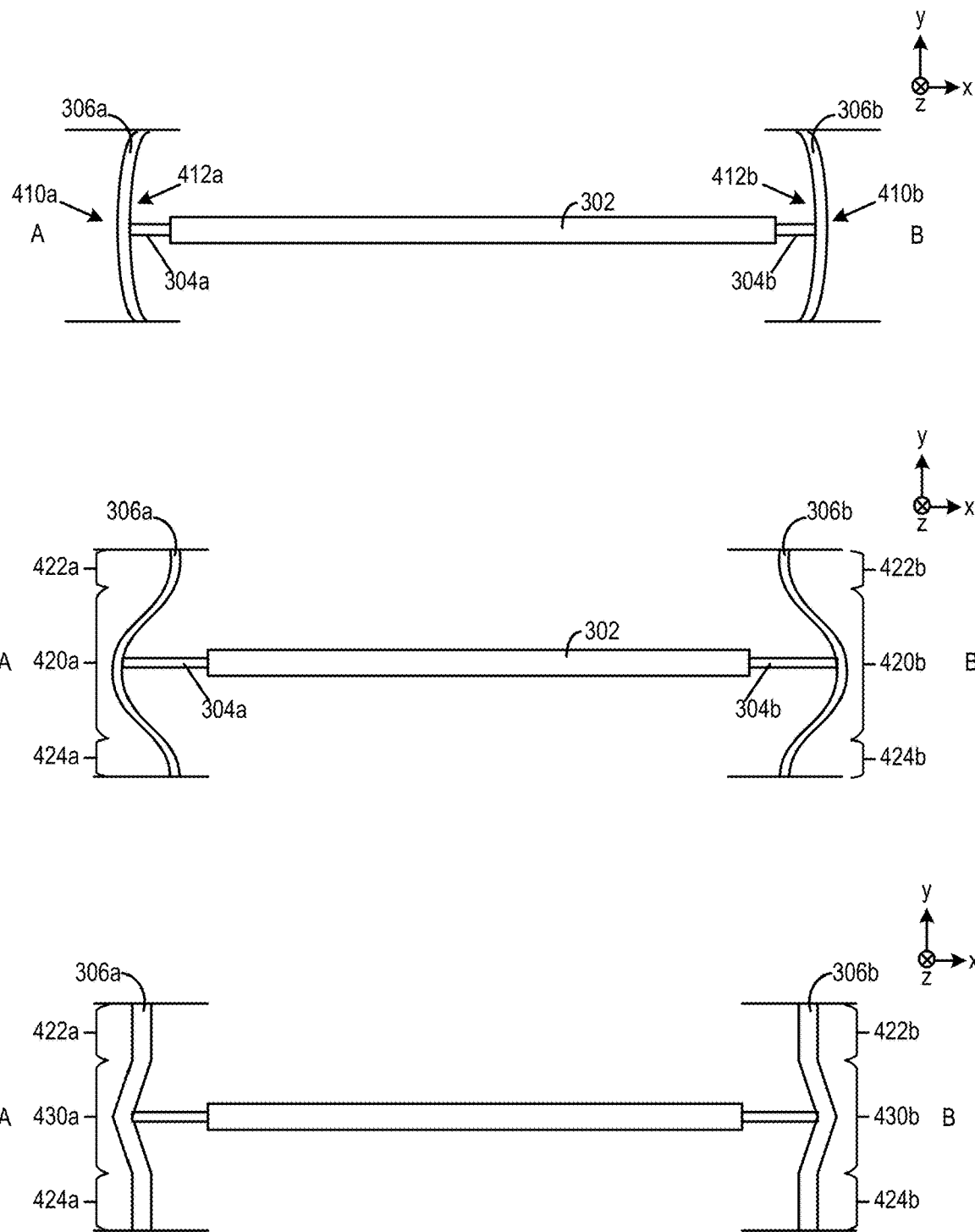

Various shapes of flexible support structures are proposed. As shown in FIG. 4C, a flexible support structure may include an arc portion, a triangular portion, etc., each having the concave side and the convex side. In some examples, the arc portion/triangular portion can be directly connected to the substrate. In some examples, the flexible support structure may also include a straight portion connected between the arc/triangular portion and the substrate. The straight portion can be connected to the substrate at substantially a right angle to, for example, improve the fabrication of the flexible support structures, to improve the strength of connection between the flexible support structures and the substrate, etc. In some examples, the arc portion and the straight portion can follow a sinusoidal function such that the straight portion forms a right angle with the substrate. Moreover, the connection structure also forms a right angle with the flexible support structure, which can also improve the strength of connection between the connection structure and the flexible support structure.

Figure 4D:
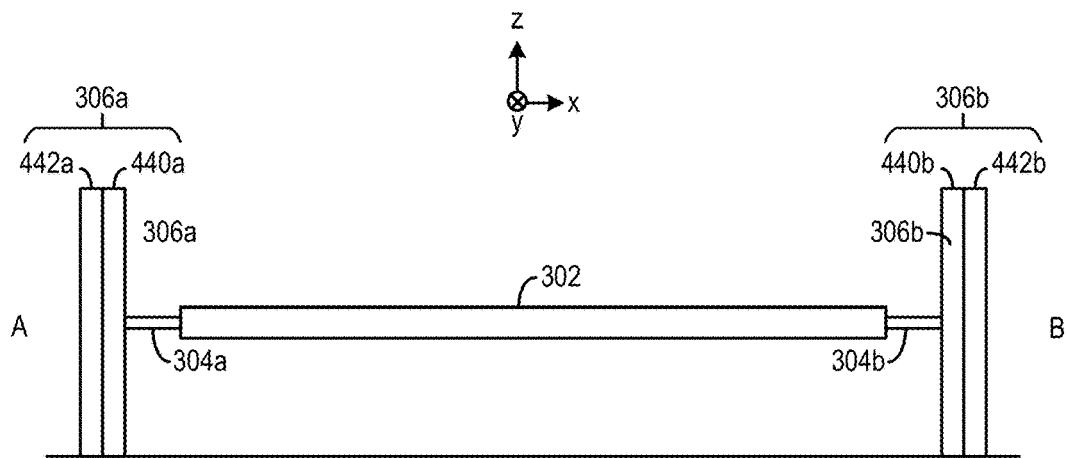
Figure 4D:
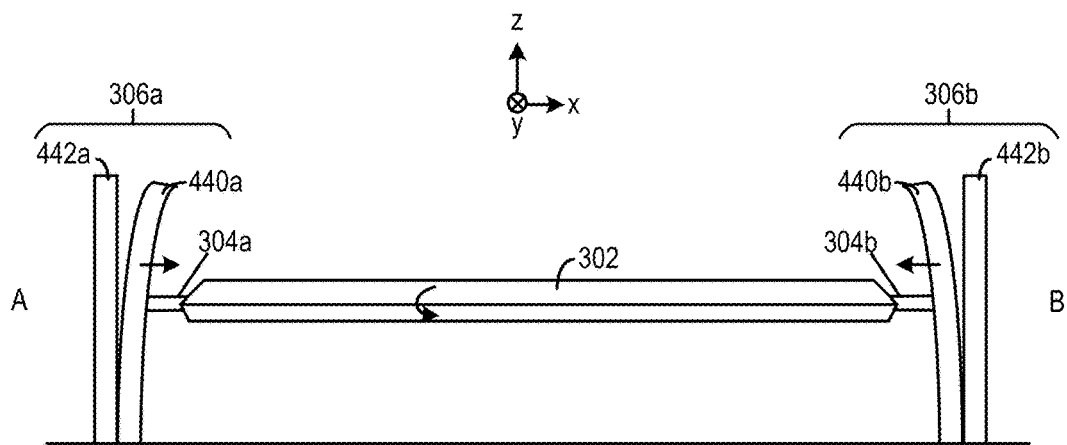
Figure 4D:
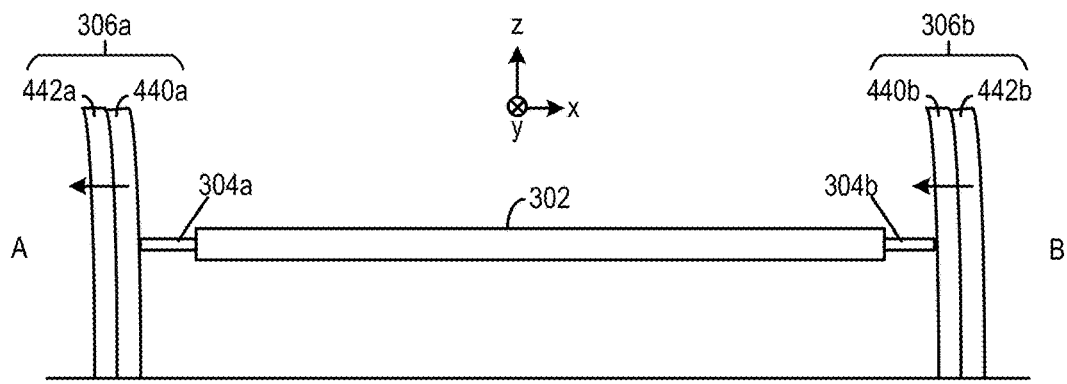

In some examples, as shown in FIG. 4D, a flexible support structure can include two separate sub-structures having different spring stiffness, with a first sub-structure being connected to the micro-mirror and a second sub-structure separated from the micro-mirror by the first sub-structure. The different spring stiffness between the two sub-structures can be due to, for example, having different materials, different geometric dimensions (e.g., the second sub-structure much wider/thicker than the first sub-structure), different geometric shapes, etc. In some examples, each sub-structure can be in the form of a plate and are separable from each other. The first sub-structure can have a low spring stiffness to provide a relatively small resistive force to counter a movement towards the micro-mirror, whereas the second sub-structure can have a high spring stiffness to provide a large resistive force to counter a movement away from the micro-mirror. When the micro-mirror rotates, it can pull and bend the first sub-structure away from the second sub-structure, due to the low spring stiffness of the first sub-structure. But when the micro-mirror undergoes a translational movement, the micro-mirror can be pushed against the second sub-structure of one of the flexible support structures. The high spring stiffness of the second sub-structure can then limit the translational movement of the micro-mirror.

Figure 6A:
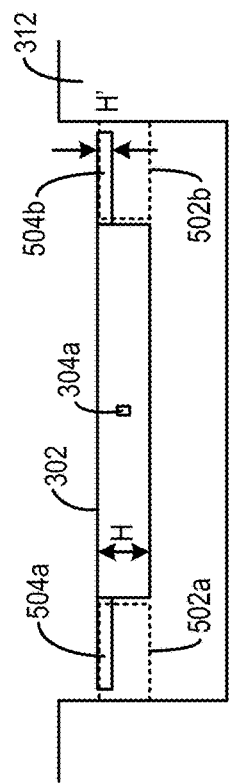
FIG. 6A and FIG. 6B illustrate example techniques to reduce the moment of inertia of a micro-mirror in the example micro-mirror assembly of FIG. 5, according to examples of the present disclosure.
Figure 6A:
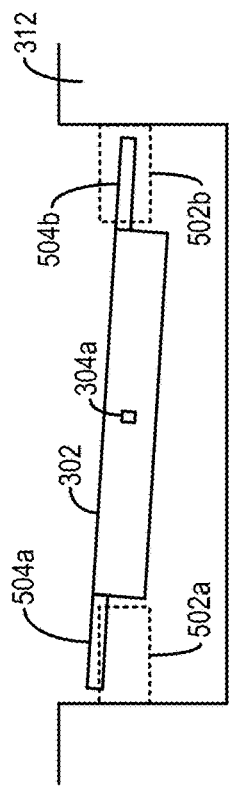
Figure 6B:
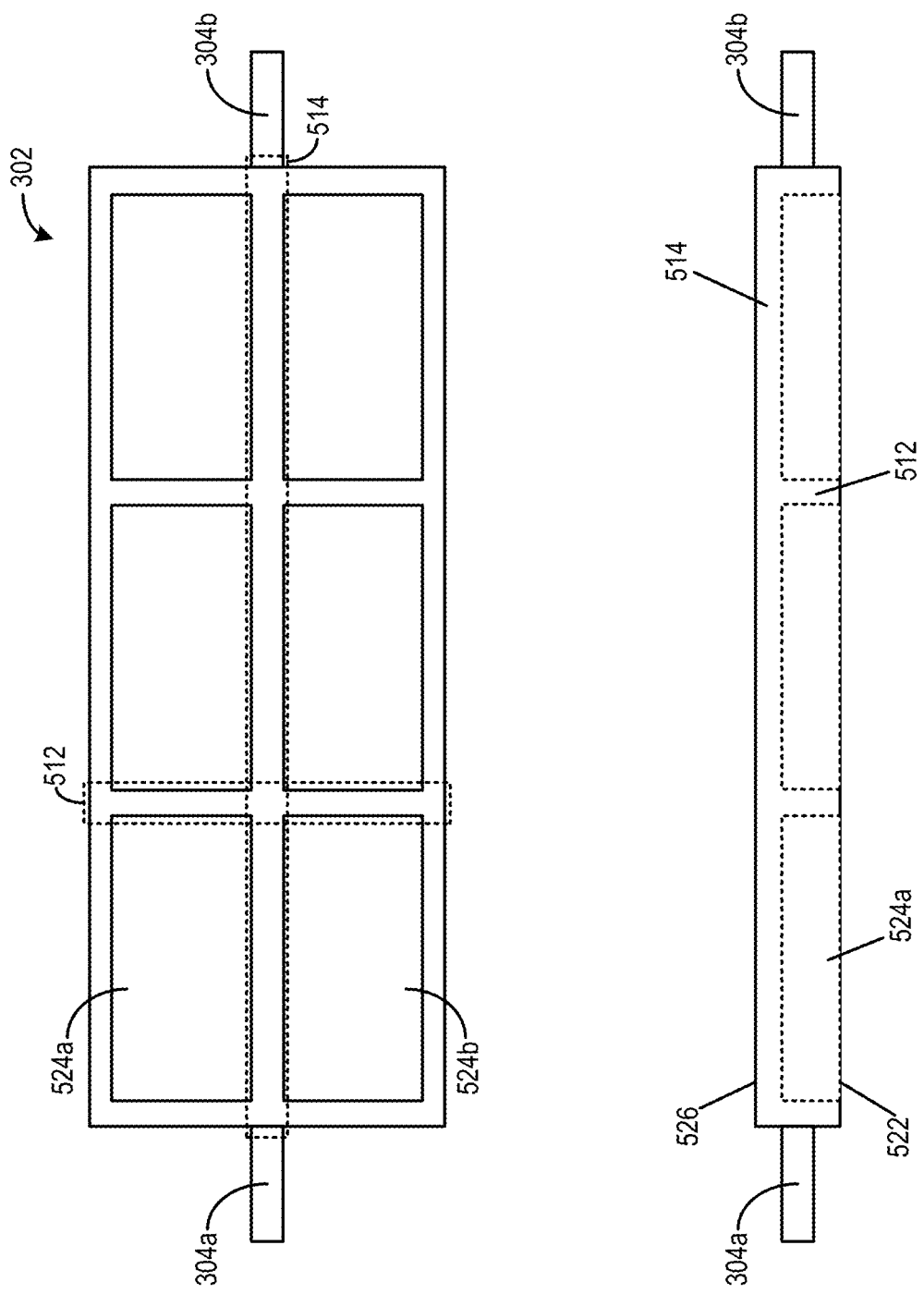

In addition, the control of a micro-mirror can also be facilitated by reducing the moment of inertia of the micro-mirror, which allows for reduced spring stiffness of the connection structure. A smaller moment of inertia also allows a larger rotation angle to be achieved for a given torque/force even for a large micro-mirror (provided for a large aperture size). Various techniques are disclosed to reduce the moment of inertia of the micro-mirror. In some examples, as shown in FIG. 6A, in a case where the micro-mirrors include fingers at the periphery as part of a comb drive, such that the fingers are mechanically and directly connected to the micro-mirrors, the thickness of the fingers can be reduced to reduce the moment of inertia as well as air damping, which reduces energy loss in the oscillatory rotation of the micro-mirror. In addition, as shown in FIG. 6B, to further reduce the moment of inertia of the micro-mirror, instead of having the micro-mirror formed as a plate having a uniform thickness, a network of ridge structures can be formed on a back side of the micro-mirror body, while the front side of the micro-mirror body provides a smooth reflective surface. The network of ridge structures not only reduces the total mass of the micro-mirror, but also reduces the mass at the furthest from the pivot point of the micro-mirror assembly, hence reducing the overall moment of inertia of the micro-mirror. Moreover, the network of ridge structures can intersect to improve the rigidity of the network as well as the micro-mirror body.

Figure 7A:
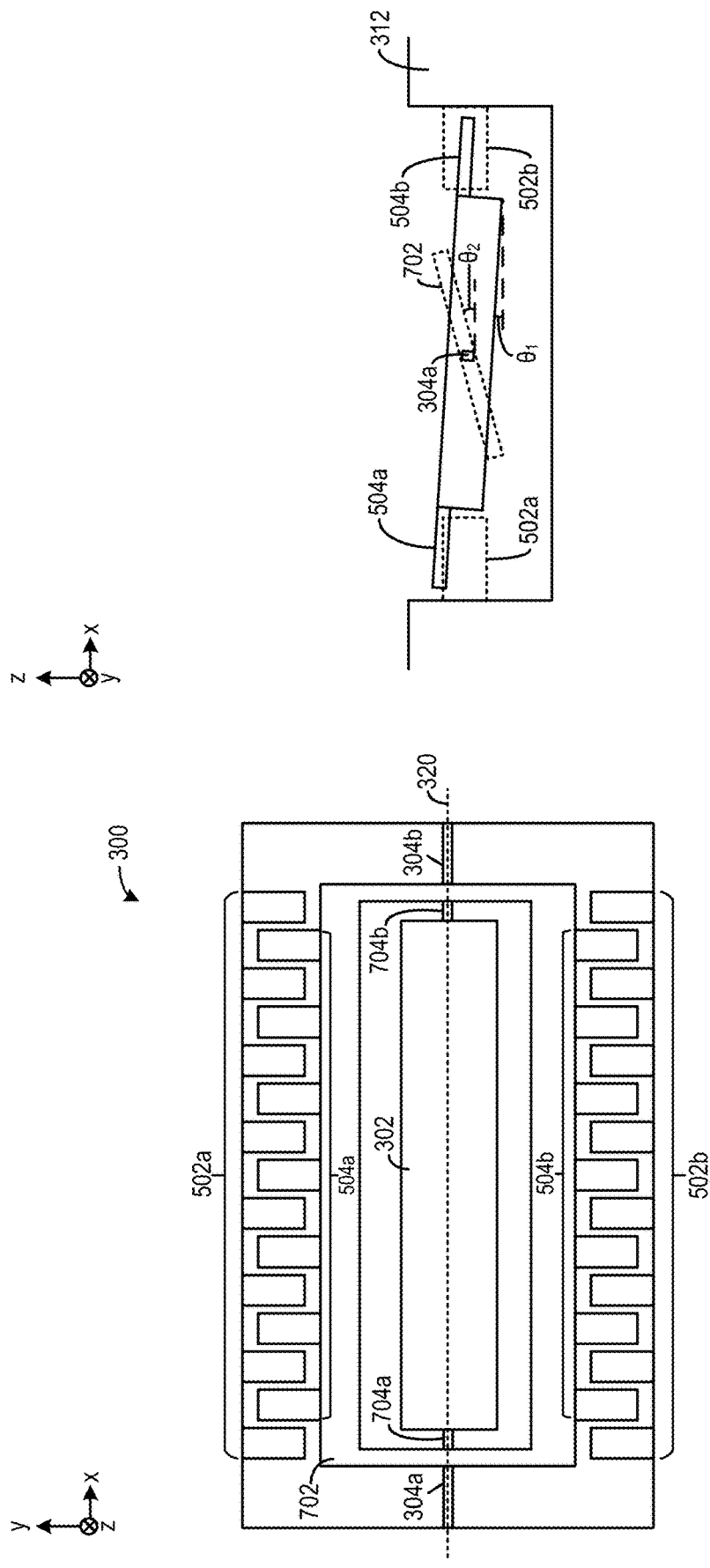
FIG. 7A, FIG. 7B, and FIG. 7C illustrate additional examples of micro-micro assembly of FIG. 6A and FIG. 6B, according to examples of the present disclosure.
Figure 7B:
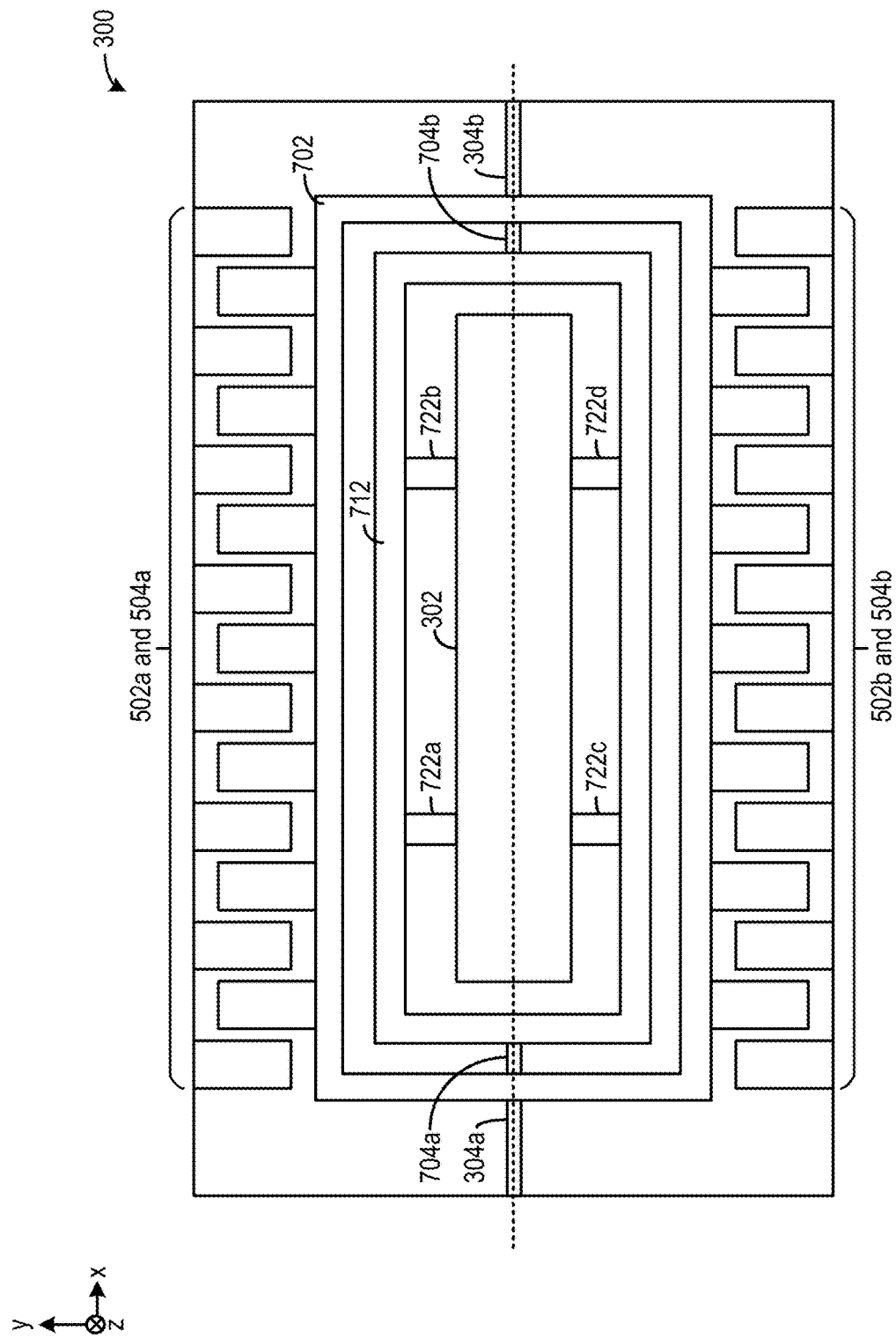
Figure 7C:
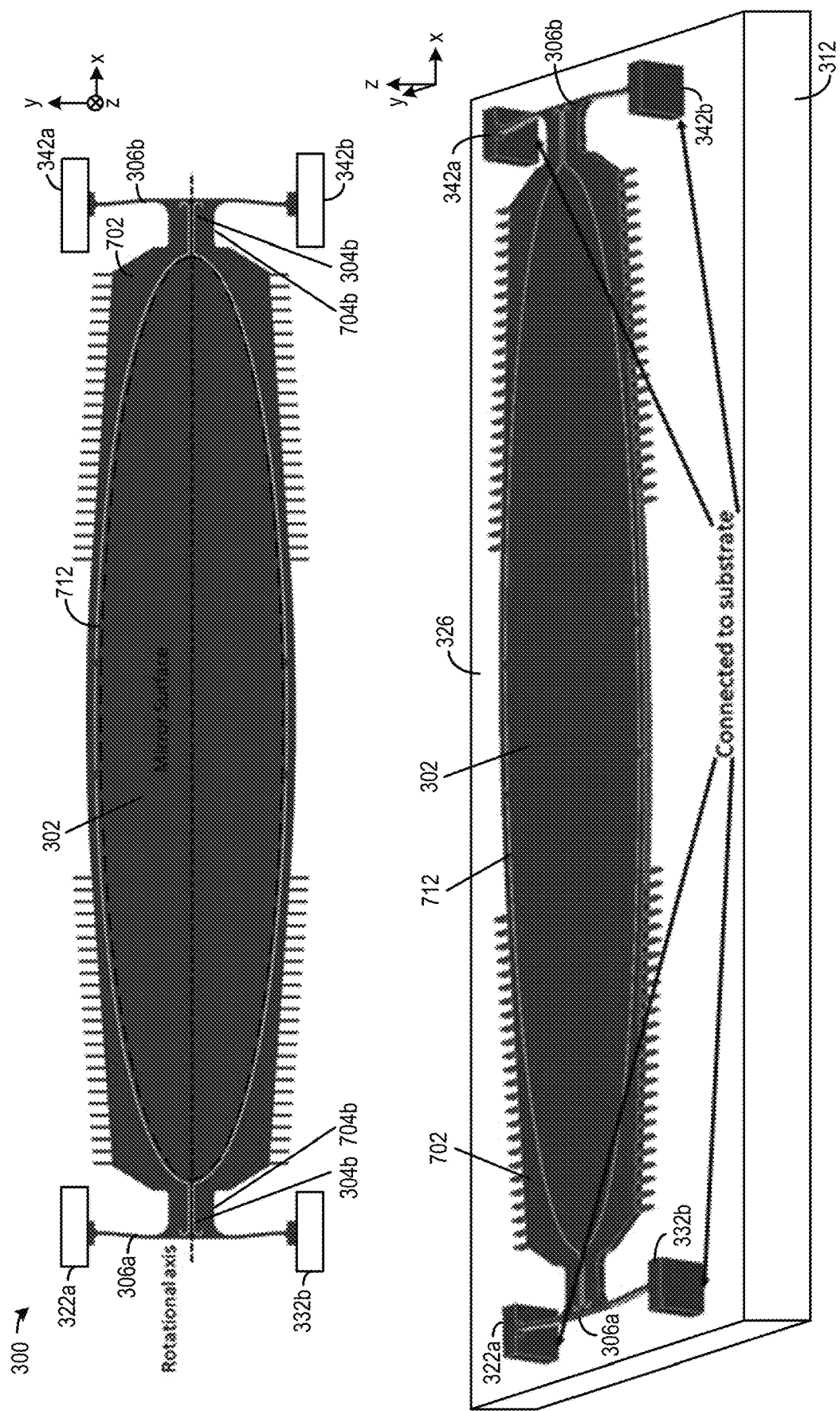

Besides reducing the moment of inertia of the micro-mirror, additional techniques are disclosed to improve the control of the micro-mirror, such as rotating the micro-mirror via an indirect scheme in which the fingers are mechanically connected to the micro-mirror via another structure, such as one or more frames that surround the micro-mirror. Specifically, as shown in FIG. 7A, FIG. 7B, and FIG. 7C, the micro-mirror assembly includes a first frame that surrounds the micro-mirror. The first frame can be configured as a first gimbal, in which a first pair of connection structures can connect between the substrate (or flexible support structures of FIG. 3A-FIG. 4B) and the first frame at a first set of pivot points, whereas a second pair of connection structures can connect between the first frame and the micro-mirror at a second set of pivot points. The first frame can rotate around the first set of pivot points with respect to the substrate, whereas the micro-mirror can rotate around the second set of pivot points with respect to the first frame and the substrate. In addition, the first frame can include the fingers of the comb drive, and the fingers can have a smaller thickness than the first frame to reduce the moment of inertia of the first frame. The comb drive can cause the first frame to rotate around the first connection structures, and the first frame can then rotate the micro-mirror via the second connection structures. Due to the elasticity of the second connection structures between the first frame and the micro-mirror, the first frame and the micro-mirror can operate according to a mechanical amplification scheme in which when the first frame rotates by a first angle, the micro-mirror rotates by a second angle (but at a different phase) that is larger than the first angle, hence, the micro-mirror amplifies the rotation movement of the first frame. In some examples, the micro-mirror assembly may include a second frame surrounded by the first frame and connected to the first frame at the second pivot points. The second frame can surround and support the micro-mirror to reduce the deformation of the micro-mirror caused by sheer strain of the second connection structure.

The aforementioned indirect scheme can improve the control of the micro-mirror in various ways. Specifically, via the mechanical amplification scheme, the required rotation angle of the first frame to achieve a particular target rotation angle of the micro-mirror can be reduced. Because of the reduced rotation angle, it becomes less likely that the second set of fingers of the frame becomes disengaged from the first set of fingers and no longer experiences the electrostatic force, in which case the frame is no longer under the control of the comb drive. In addition, due to the reduced rotation angle, the degree of spring stiffness of the first connection structures between the frame and the substrate can reduce, which can reduce the non-linearity of required torque with respect to the rotation angle. All these can make the required torque to become more linear with respect to the rotation angle Further, the torque required to achieve a particular rotation angle and to sustain the rotation angle in the oscillatory rotation can be reduced due to the reduced moment of inertia (e.g., reduced based on using the flexible support structures), mechanical amplification from the indirect driving scheme, as well as reduced air damping. As a result, not only does the torque become more linear with respect to the rotation angle, but also the required torque for a particular rotation angle is reduced, which can simplify the control of the micro-mirror and reduce the requirements on the actuator.

In some examples, the array of micro-mirror assemblies can be implemented in a silicon-on-insulator (SOI) wafer comprising a first silicon layer, a second silicon layer, and an insulator layer (e.g., Silicon Dioxide) sandwiched between the first silicon layer and the second silicon layer. The insulator and the second silicon layer can be patterned by a back-side etching process to form the network of ridge structures underneath the micro-mirror. While the patterned SOI wafer is bonded to a handle wafer, a front-side etching process can be performed on the front side of the SOI wafer. The first silicon layer can be patterned to form the micro-mirror, the frame, the gimbal, the first set of fingers, and the second set of fingers of each micro-mirror assembly.

Typical System Environment for Certain Examples

FIG. 1 illustrates an autonomous vehicle 100 in which the disclosed techniques can be implemented. Autonomous vehicle 100 includes a LiDAR module 102. LiDAR module 102 allows autonomous vehicle 100 to perform object detection and ranging in a surrounding environment. Based on the result of object detection and ranging, autonomous vehicle 100 can maneuver to avoid a collision with the object. LiDAR module 102 can include a light steering transmitter 104 and a receiver 106. Light steering transmitter 104 can project one or more light signals 108 at various directions at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light pulse 110, and can perform a ranging determination (e.g., a distance of the object) based on a time difference between light signals 108 and 110. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can adjust its speed (e.g., slowing or stopping) to avoid collision with object 112 based on the detection and ranging of object 112 by LiDAR module 102.

Figure 2A:
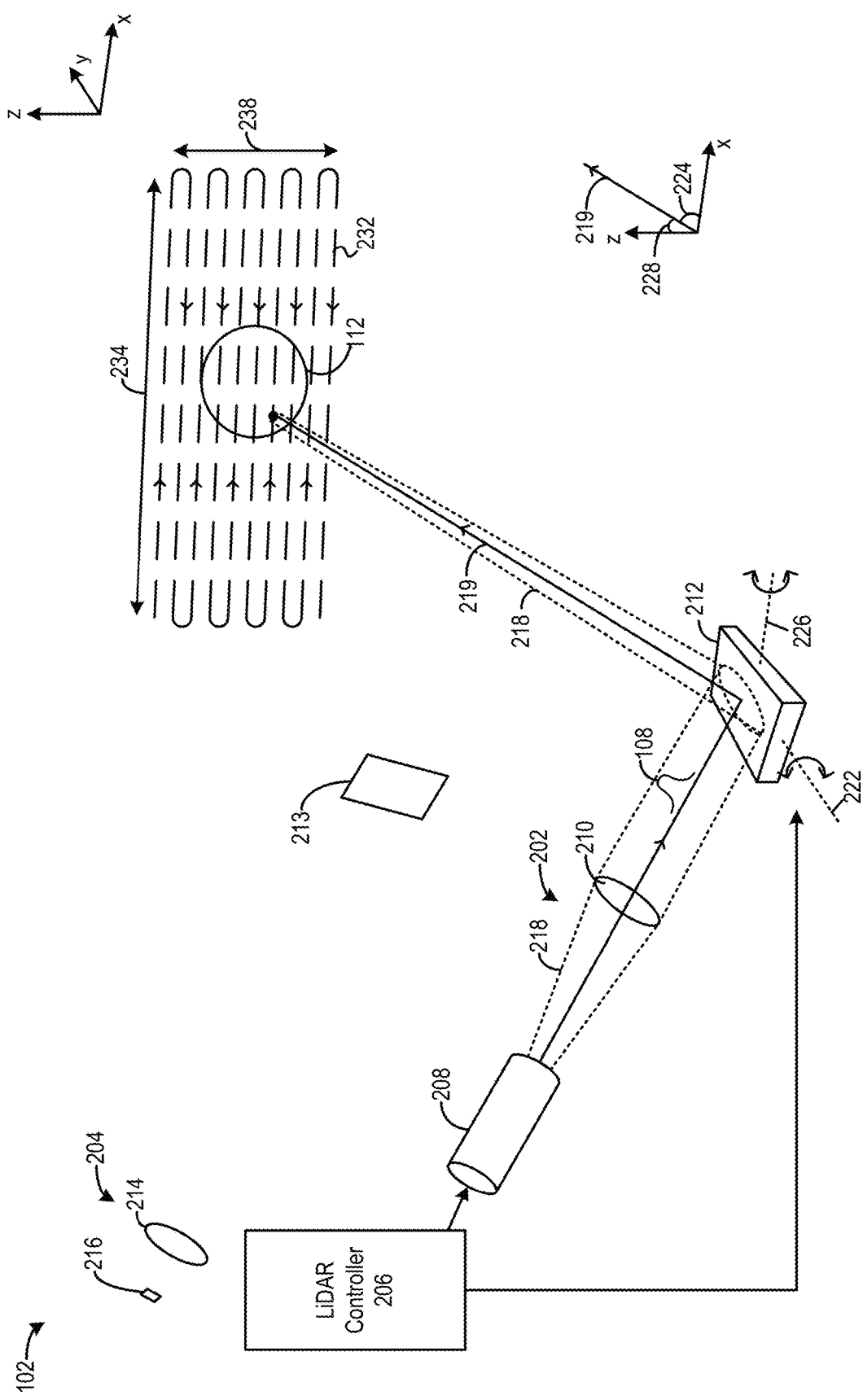
FIG. 2A, FIG. 2B, FIG. 2C, FIG. 2D, and FIG. 2E illustrate examples of a light steering system and properties of internal components of the light steering system, according to certain examples.
Figure 2B:
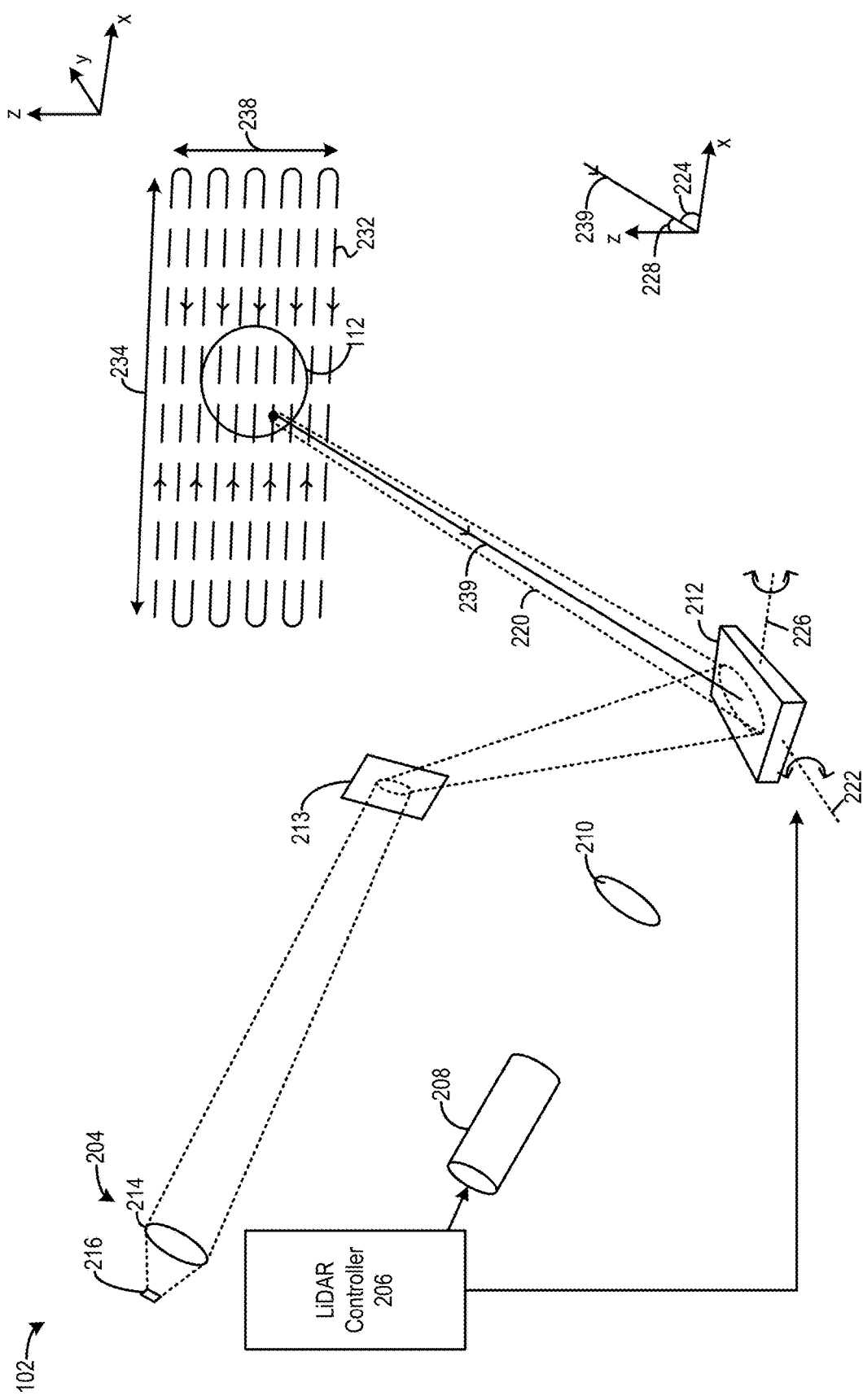
Figure 2C:
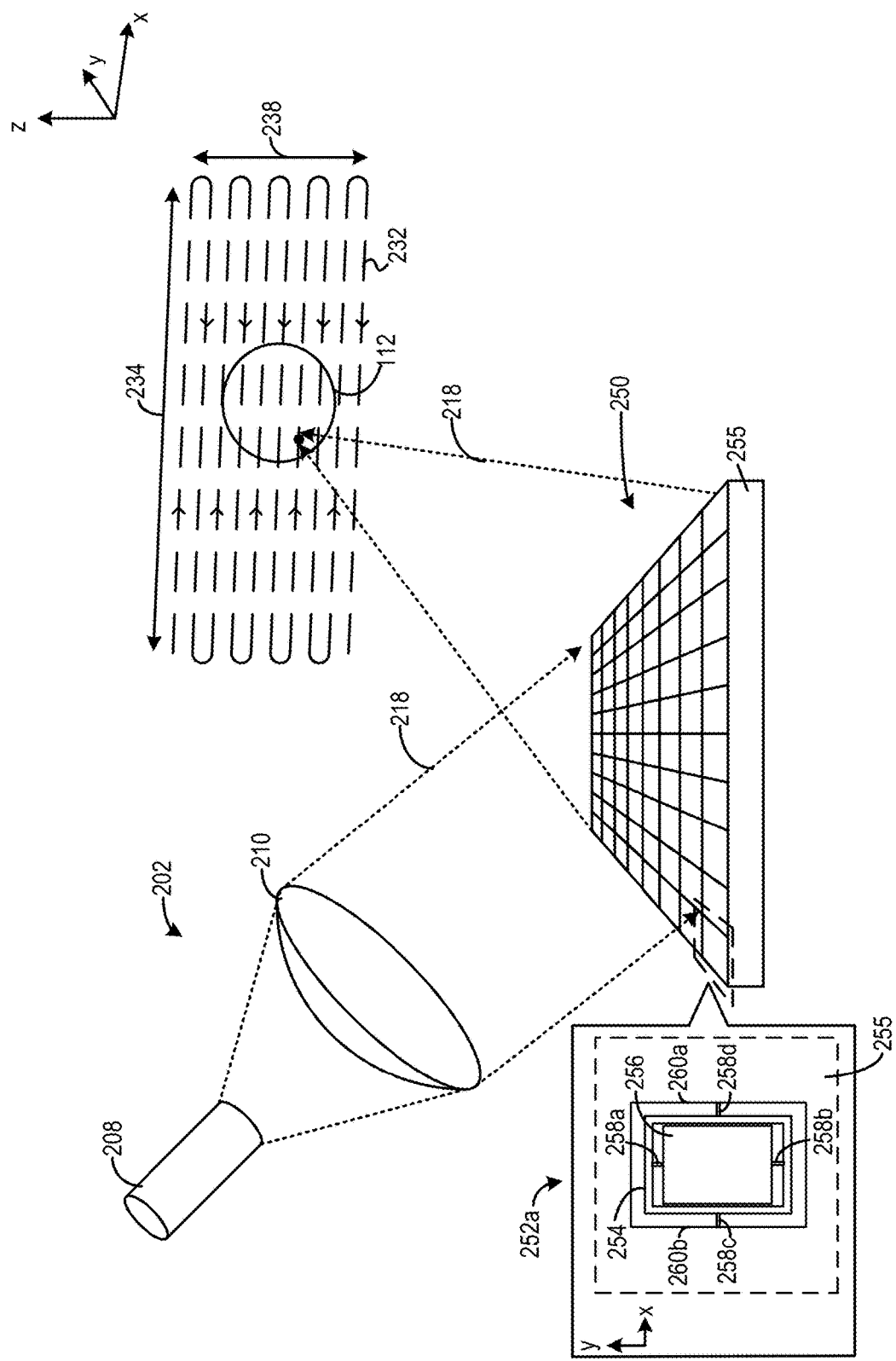
Figure 2D:
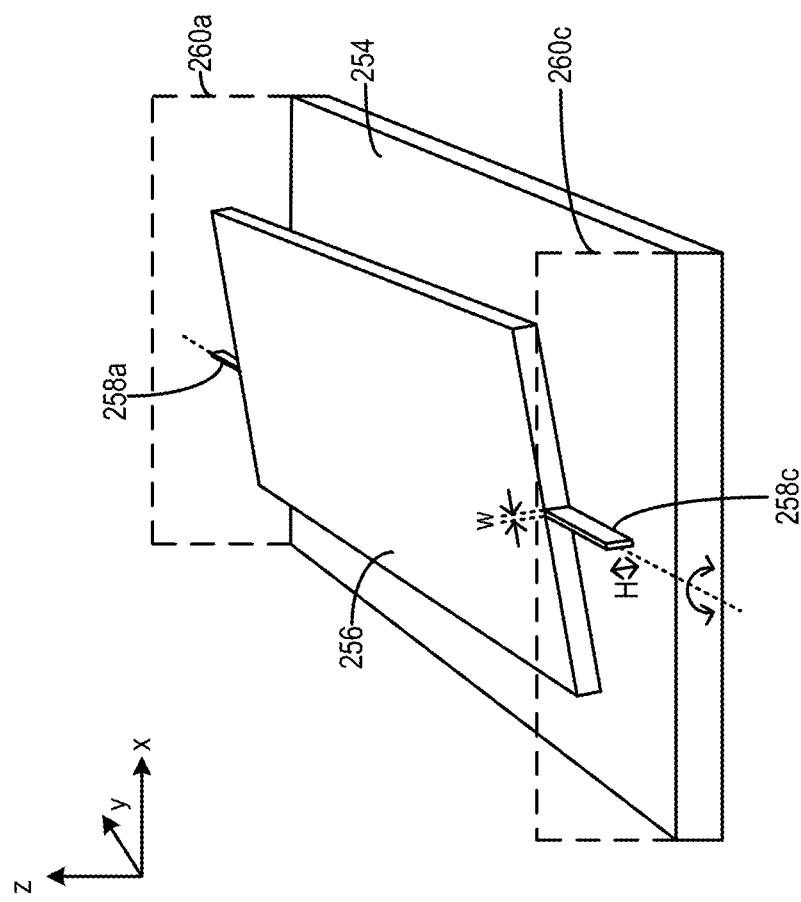
Figure 2D:
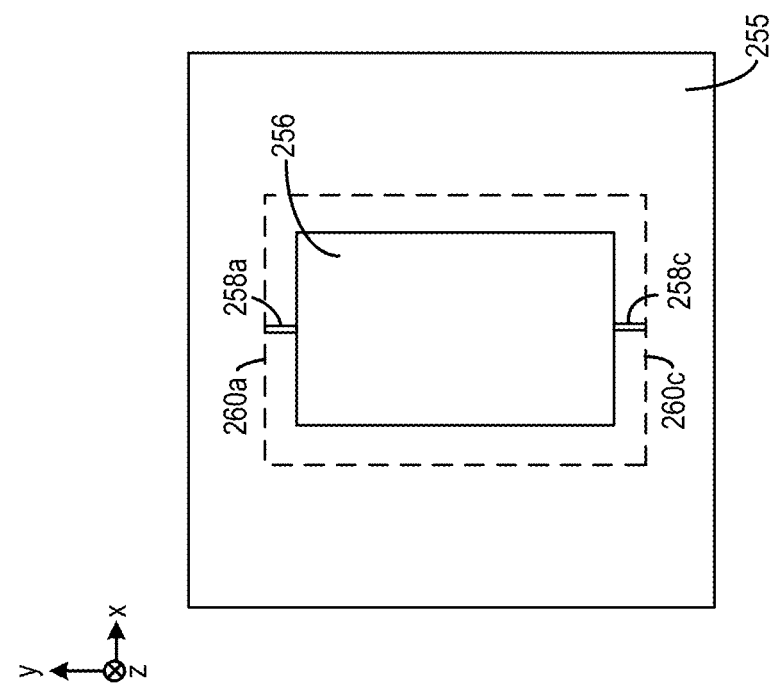

FIG. 2A-FIG. 2C illustrate examples of internal components of a LiDAR module 102. LiDAR module 102 includes a transmitter 202, a receiver 204, a LiDAR controller 206 which controls the operations of transmitter 202 and receiver 204. Transmitter 202 includes a light source 208 and a collimator lens 210, whereas receiver 204 includes a lens 214 and a photodetector 216. LiDAR module 102 further includes a mirror assembly 212. LiDAR module 102 may further include a beam splitter 213. In LiDAR module 102, transmitter 202 and receiver 204 can be configured as a coaxial system to share mirror assembly 212 to perform light steering operation, with beam splitter 213 configured to reflect incident light reflected by mirror assembly 212 to receiver 204.

FIG. 2A illustrates a light projection operation. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light 218 to steer it along an output projection path 219 towards object 112. Mirror assembly 212 can include one or more rotatable mirrors. FIG. 2A illustrates mirror assembly 212 as having one mirror, but as to be described below, a micro-mirror array comprising multiple micro-mirror assemblies can be used to provide the steering capability of mirror assembly 212. Mirror assembly 212 further includes one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form reflected light signal, which can be received by receiver 204.

FIG. 2B illustrates a light detection operation. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112, such as light signal 110 generated by the reflection of collimated light beam 218 by object 112, and not to receive other signals. As a result, the effect of environmental disturbance on the ranging/imaging of the object can be reduced, and the system performance can be improved.

FIG. 2C illustrates an example of a micro-mirror array 250 that can be part of light steering transmitter 202 and can provide the steering capability of mirror assembly 212. Micro-mirror array 250 can include an array of micro-mirror assemblies, including micro-mirror assembly 252. Micro-mirror assembly 252 can include a microelectromechanical system (MEMS) implemented on a semiconductor substrate 255. Micro-mirror assembly 252 may include a frame 254 and a micro-mirror 256 forming a gimbal structure. Specifically, connection structures 258a and 258b connect micro-mirror 256 to frame 254, whereas connection structures 258c and 258d connect frame 254 (and micro-mirror 256) to side walls 260a and 260b semiconductor substrate 255 at a pair of pivot points. A pair of connection structures can define a pivot/axis of rotation for micro-mirror 256. For example, connection structures 258a and 258b can define a pivot/axis of rotation of micro-mirror 256 about the y-axis within frame 254, whereas connection structures 258c and 258d can define a pivot/axis of rotation of frame 254 and micro-mirror 256 about the x-axis with respect to semiconductor substrate 255.

A micro-mirror assembly 252 can receive and reflect part of light beam 218. Micro-mirror 256 of micro-mirror assembly 252 can be rotated by an actuator of the micro-mirror assembly (not shown in FIG. 2B) at a first angle about the y-axis (around connection structures 258a and 258b) and at a second angle about the x-axis (around connection structures 258c and 258d) to set the direction of output projection path for light beam 218 and to define the FOV, as in FIG. 2A, or to select the direction of input light to be detected by receiver 204, as in FIG. 2B. FIG. 2C illustrates another view of micro-mirror assembly 252 including connection structures 258a and 256c having a width w and a thickness H.

To accommodate the rotation motion of mirror 256, connection structures 258a, 258b, 258c, and 258d are configured to be elastic and deformable. The connection structure can be in the form of, for example, a torsion bar, a spring, etc., and can have a certain spring stiffness. The spring stiffness of the connection structure can define a torque required to rotate mirror 256 by a certain rotation angle, as follows:

$$\tau = -K\theta \quad \text{(Equation 1)}$$

In Equation 1, τ represents torque, K represents a spring constant that measures the spring stiffness of the connection structure, whereas θ represents a target angle of rotation. The spring constant can depend on various factors, such as the material of the connection structure, the cross-sectional area of the connection structure, etc. For example, the spring constant can be defined according to the following equation:

$$K = \frac{k_2 \times G \times w^3 \times H}{L} \quad \text{(Equation 2)}$$

In Equation 2, L is the length of the connection structure, G is the shear modulus of material that forms the connection structure, $k_2$ is a factor that depends on the ratio between thickness (H) and width (w) given as H/w.

Based on Equations 1 and 2, different torques can be applied to the micro-mirror to achieve different target rotation angles to start the rotation. The actuator can then remove the torque, and the elasticity of the connection structure, defined by the spring constant, can return micromirror 256 back to its default orientation to begin the next rotation. The rotation of micro-mirror 256 can be repeated in the form of oscillation. When in a steady state, micro-mirror 256 can rotate at a resonant frequency ω based on the spring constant of connection structures 258a-d as well as the mass of micro-mirror 256, as follows:

$$\omega = \sqrt{\frac{K}{J}} \quad \text{(Equation 3)}$$

In Equation 3, K is the spring constant of connection structures 258a-d, whereas J is the moment of inertia of micro-mirror 256. The actuator can apply and then remove a torque at the natural frequency of the micro-mirror to maintain the oscillation. During steady state, a torque can be applied at the resonant frequency to overcome the damping to the oscillation. The damping can be caused by various sources, such as air friction encountered by the micro-mirror as the micro-mirror rotates, which introduces air damping.

Figure 2E:
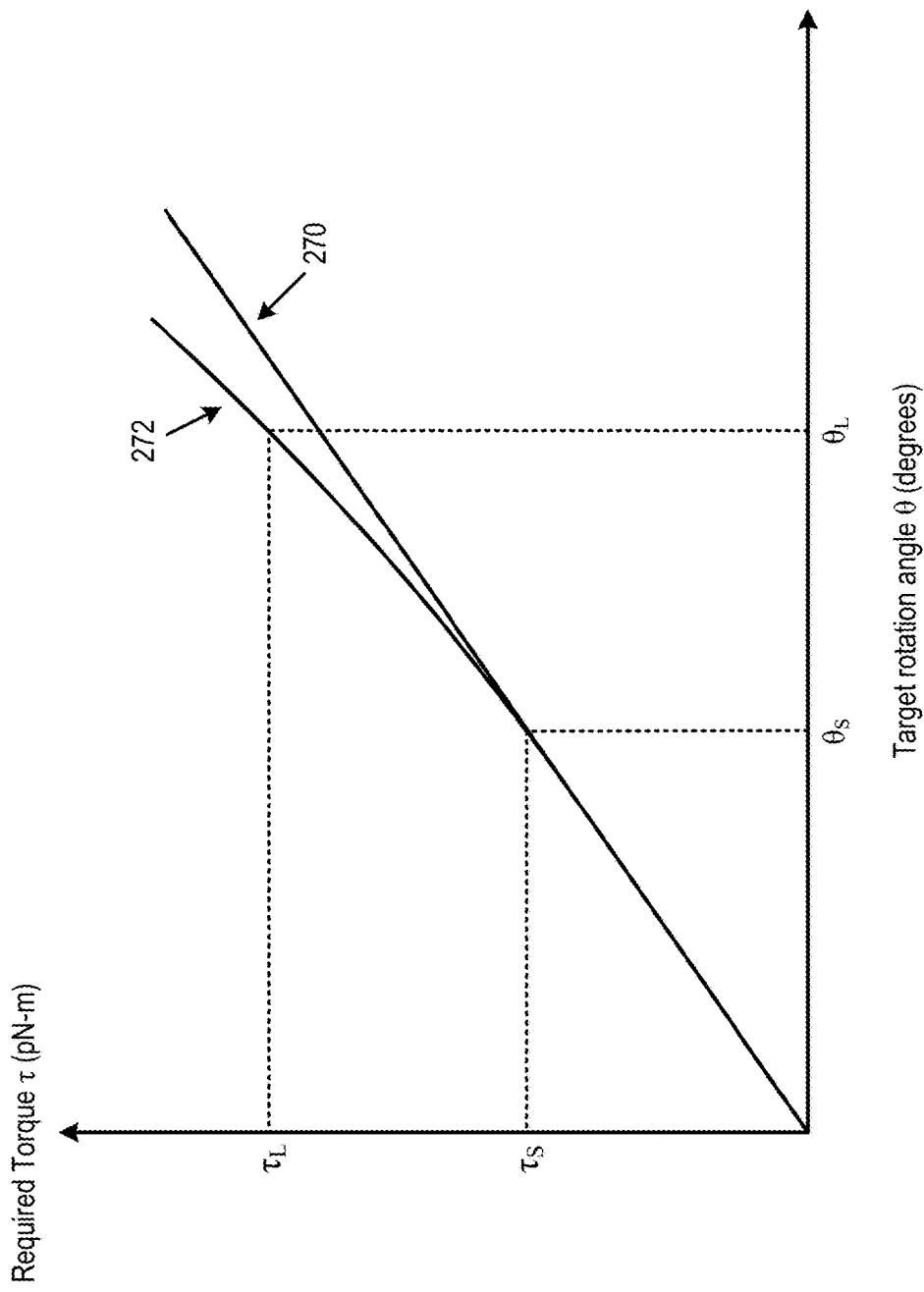

FIG. 2E illustrates examples of relationships between a target rotation angle θ and the required torque τ to achieve the target rotation angle for connection structures 258a-d. As shown in FIG. 2E, graph 270 illustrates a linear relationship between the required torque and the target rotation angle, in which the spring constant K remains constant within a range of target rotation angles. Moreover, graph 272 illustrates a non-linear relationship between the required torque and the target rotation angle, in which the spring constant K increases as the target rotation angle increases. As a result, the torque $\tau_L$ required to rotate the micro-mirror by a large target rotation angle $\theta_L$, can become disproportionately large compared with the torque is required to rotate the micro-mirror by a small target rotation angle $\theta_S$.

The spring constant K can become constant across a range of target rotation angles when the ratio between thickness (H) and width (w) of the connection structure is large. The larger the ratio H/w, the more the factor $k_2$ of Equation 2 is like a constant. On the other hand, when the ratio H/w is reduced due to, for example, an increased width, the factor $k_2$ and the spring constant K may increase with the target rotation angle.

There can be various reasons for increasing the width of connection structures 258a-d and the degree of stiffness of connections structures 258a-d. One reason can be due to a large moment of inertia of micro-mirror 256. The moment of inertia of micro-mirror 256 may increase due to an increase in the size (and mass) of micro-mirror 256. The size of micro-mirror 256 can be increased to increase the reflective surface area, which can increase the aperture size and improve the FOV and detection range of LiDAR module 102. But with the micro-mirror having a larger moment of inertia, the connection structures need to have a higher spring stiffness to improve the structural integrity of the pivot points, otherwise the connection structure may break due to the repeated rotation of the micro-mirror. In addition, the width of connection structures 258a-d and the degree of stiffness (spring constant K) of connections structures 258a-d can be increased, to increase the resonant frequency ω of rotation of micro-mirror 256. The resonant frequency can be increased to improve the resolution (in time) of the scanning operation. With a higher resonant frequency, the micro-mirrors can repeat the scanning operation at a higher rate, which allows the detection/measurement operation of objects to be performed at a higher rate, which can improve the resolution of the detection/measurement operation.

Increasing the overall spring stiffness of the connection structures, however, can increase the non-linearity of required torque with respect to rotation angle. For example, as shown in graph 272 of FIG. 2D, the degree of spring stiffness can increase at a much higher rate at a relatively large rotation angle rather than at a relatively small rotation angle, which means a disproportionately large torque is needed to achieve a large target rotation angle. This makes the micro-mirror more difficult to control and may increase the complexity of the control algorithm.

Example Techniques to Improve Linearity of Torque with Respect to Rotation Angle FIG. 3A, FIG. 3B, and FIG. 3C illustrate examples of a micro-mirror assembly that can address at least some of the issues described above. As shown in FIG. 3A-FIG. 3C, a micro-mirror assembly 300 can include a micro-mirror 302, a connection structure 304a and a connection structure 304b, a flexible support structure 306a, and a flexible support structure 306b. In FIG. 3A-FIG. 3C, connection structure 304a is connected to flexible support structure 306a at a pivot point 318a (denoted by a dark dot), whereas connection structure 304b is connected to flexible support structure 306b at a pivot point 318b (denoted by a dark dot). Pivot point 318a and pivot point 318b can form a rotation axis 320 above which micro-mirror 302 rotates. Similar to connection structures 258a-258d of FIG. 2B and FIG. 2C, connection structures 304a and 304b can be in the shape of a torsion bar, a spring, etc. Connection structures 304a and 304b are elastic and have pre-determined degrees of spring stiffness to accommodate the rotation of micro-mirror 302 when an actuator (not shown in FIG. 3A and FIG. 3B) applies a torque to micro-mirror 302 to rotate the micro-mirror from a default orientation (e.g., when the mirror is on the x-y plane). Connection structures 304a and 304b can return micro-mirror 302 back to its default orientation when the torque is removed. Micro-mirror 302 can be rotated by different kinds of actuators, such as electrostatic actuators (e.g., comb drives), electromagnetic actuators, piezoelectric actuators, magnetostrictive actuators, etc.

Moreover, flexible support structures 306a and 306b are connected directly or indirectly to substrate 312 to suspend micro-mirror 302 in the free space above substrate 312, which allows micro-mirror 302 to rotate. As to be described below, flexible support structures 306a and 306b are flexible and elastic to allow pivot points 318a and 318b to move inwards and towards micro-mirror 302 to accommodate the rotation of micro-mirror 302.

Various examples of placement of the flexible support structures are disclosed. FIG. 3A illustrates a top view (viewing from z-axis) of an example of micro-mirror assembly 300. As shown in FIG. 3A, flexible support structure 306a can be connected to a pair of rigid support structures 322 (e.g., 322a and 322b), whereas flexible support structure 306b can be connected to a pair of rigid support structures 324 (e.g., 324a and 324b). Both rigid support structures 322 and 324 can be erected on a surface 326 of substrate 312 to suspend flexible support structures 306a and 306b, as well as connection structures 304a and 304b and micro-mirror 302 in the air. In some examples, rigid support structures 322 and 324 can be in the shape of rectangular blocks/walls. In addition, as shown in FIG. 3B, which shows a side view (viewing from y-axis) of micro-mirror assembly 300, flexible support structures 306a and 306b are directly erected on and connected to surface 326 of substrate 312 to suspend micro-mirror 302 in the free space above substrate 312, which allows micro-mirror 302 to rotate.

In yet another example, as shown in FIG. 3C, which shows a side view of micro-mirror assembly 300, substrate 312 comprises an array of cavities including cavity 330. Cavity 330 comprises a ceiling portion 332 and a bottom portion 334. Both flexible support structures 306a and 306b can be sandwiched between ceiling portion 332 and bottom portion 334 of cavity 330. In all these examples, one or more portions of each of flexible support structures 306a and 306b are connected to the substrate (e.g., the bottom and ceiling portions, the substrate surface, etc.) at fixed points to set the position of the micro-mirror, while the other portions of the first and second flexible support structures can bend to accommodate the rotation of the micro-mirror.

As shown in the bottom diagram of FIG. 3A-FIG. 3B, both flexible support structures 306a and 306b are elastic to allow pivot points 318a and 318b to move towards micro-mirror 302 (denoted by arrows) when the micro-mirror rotates. Specifically, when micro-mirror 302 rotates from a default orientation (e.g., parallel with the x-y plane), each of connection structures 304a and 304b can have a shearing deformation towards the micro-mirror. Both flexible support structures 306a and 306b can bend to allow the pivot points 318a and 318b to move towards the micro-mirror to reduce the shearing deformation of connection structures 304a and 304b. As sheer deformation increases the degree of stiffness in connection structures 304a and 304b reduces, the degree of spring stiffness of both connection structures can be reduced, which can improve the linearity between the required torque and the rotation angle can be improved as a result.

Due to elasticity, both flexible support structures 306a and 306b can provide a resistive force to counter the movement of pivot points 318a and 318b and to hold micro-mirror 302 at a pre-determined position. Both flexible support structures 306a and 306b can be configured to provide different resistive forces for different directions of movement of pivot points 318a and 318b to reduce the translational movement of micro-mirror 302 caused by, for example, an external force from vehicle 100 on LiDAR 102 when the vehicle accelerates, as well as shocks and vibrations received by LiDAR 102 when vehicle 100 moves, while accommodating the rotation movement of micro-mirror 302. Reducing the translation movement of micro-mirror 302 (and the entire array of micro-mirror assemblies) is essential, as such movement can disturb the scanning operation and change the projection paths of light reflected by the micro-mirrors, which can reduce the FOV or otherwise introduce errors in the object detection/measurement operations.

FIG. 4A and FIG. 4B illustrate an example configuration of flexible support structures 306a and 306b. As shown in FIG. 4A, due to elasticity, flexible support structures 306a and 306b can provide, respectively, a resistive force 402a and a resistive force 402b to counter the movement of pivot points 318a and 318b. Resistive force 402a points towards direction A (e.g., to the left) as pivot point 318a moves towards direction B (e.g., to the right) and micro-mirror 302 when the micro-mirror rotates. Meanwhile, resistive force 402b points towards direction B as pivot point 318b moves towards direction A. Both resistive forces 402a and 402b can be relatively weak to reduce the shear deformation of connection structures 304a and 304b, which can facilitate the rotation of micro-mirror 302 and improve linearity between required torque and rotation angle, as explained above.

On the other hand, flexible support structures 306a and 306b can provide a much larger resistive force in a case where a pivot point moves away from micro-mirror 302. For example, as shown in the middle diagram of FIG. 4A, both pivot points 318a and 318b may move towards direction B. The movement of pivot points 318a and 318b towards direction B can be due to a translational/linear movement of micro-mirror 302 towards direction B and not due to the rotation movement of micro-mirror 302. In the example shown in the middle diagram of FIG. 4A, flexible support structure 306a can provide a relatively small resistive force 404a that points towards direction A as pivot point 318a moves towards direction B, while flexible support structure 306b can provide a much larger resistive force 404b that points towards direction A to counter the movement of pivot point 318b towards direction B. Due to resistive force 404b, the bending of flexible support structures 306a and 306b towards direction B is reduced (compared with the top diagram), which reduces the translational movement of micro-mirror 302 towards direction B.

Similarly, as shown in the bottom diagram of FIG. 4A, both pivot points 318a and 318b may move towards direction A. The movement of pivot points 318a and 318b towards direction A can also be due to a translational/linear movement of micro-mirror 302 towards direction A and not due to the rotation movement of micro-mirror 302. In the example shown in the bottom diagram of FIG. 4A, flexible support structure 306a can provide a very large resistive force 414a that points towards direction B as pivot point 318a moves towards direction A, while flexible support structure 306b can provide a relatively small resistive force 414b that points towards direction B to counter the movement of pivot point 318b towards direction A. Due to resistive force 414a, the translational movement of micro-mirror 302 towards direction A can also be reduced.

In some examples, flexible support structures 306a and 306b can be configured to have different degrees of spring stiffness/spring constants for different directions of movement. FIG. 4B illustrates an example elasticity property of flexible support structure 306a. As shown in FIG. 4B, flexible support structure 306a can have a first spring constant $K_A$ for a displacement towards direction A, as well as a second spring constant $K_B$ for a displacement towards direction B. Spring constant $K_A$ can be small relative to spring constant $K_B$, so that flexible support structure 306a can provide a much smaller resistive force, for the same absolute amount of displacement (distance), for a movement towards direction A compared with a movement towards direction B.

The different spring constants of each of flexible support structures 306a and 306b can be achieved based on, for example, a non-symmetrical geometric shape with respect to the different directions of movements, having sub-structures built using different materials, having different geometric dimensions, shapes, etc., to provide different resistive forces for different directions of movements, etc.

FIG. 4C illustrates examples of flexible support structures 306a and 306b having non-symmetrical geometric shapes when micro-mirror 302 is at the default orientation (e.g., being parallel with the x-y plane). The examples in FIG. 4C represent example geometric shapes of flexible support structures 306a and 306b of FIG. 3C, but it is understood that the support structures in FIG. 3A and FIG. 3B also have the example geometric shapes illustrated in FIG. 4C. As shown in the top diagram of FIG. 4C, each flexible support structure can include a convex side and a concave side and is asymmetric between directions A and B (e.g., over the z-axis). For example, flexible support structure 306a can include a convex side 410a and a concave side 412a, whereas flexible support structure 306b can include a convex side 410b and a concave side 412b. Each flexible support structure can have a higher spring stiffness (e.g., $K_B$ in FIG. 4B) for a movement towards a direction facing the convex side, as well as a smaller spring stiffness (e.g., $K_A$ in FIG. 4B) for a movement towards a direction facing the concave side. For example, flexible support structure 306a can have a higher spring stiffness for a movement towards direction A facing convex side 410a and a lower spring stiffness for a movement towards direction B facing concave side 412a, whereas flexible support structure 306b can have a higher spring stiffness for a movement towards direction B facing convex side 410b and a lower spring stiffness for a movement towards direction A facing concave side 412b. Connection structures 304a and 304b can connect to, respectively, flexible support structure 306a at concave side 412a and flexible support structure 306b at concave side 412b. As a result, connection structures 304a and 304b can provide smaller resistive forces to a movement of the pivot points towards micro-mirror 302 (caused by the rotation of the micro-mirror), and provide larger resistive forces to a movement of the pivot points away from micro-mirror 302 (not caused by the rotation of the micro-mirror).

Flexible support structures 306a and 306b can have various non-symmetrical geometric shapes to have a concave side and a convex side. As shown in the top diagram, each of support structures 306a and 306b can have an arc shape directly connected to the substrate. Moreover, as shown in the bottom diagram, each of flexible support structures 306a and 306b can have an arc portion, such as arc portion 420a and arc portion 420b, each including a concave side and a convex side. In addition, each of flexible support structures 306a and 306b can also have a straight portion, such as straight portions 422a and 424a as well as straight portions 422b and 424b, to connect the respective arc portion to the substrate. The straight portions can be connected to the substrate at substantially a right angle to, for example, improve the fabrication of the flexible support structures, to improve the strength of connection between the flexible support structures and the substrate, etc. In some examples, as shown in the middle diagram of FIG. 4C, the arc portion and the straight portions of a flexible support structure can follow a sinusoidal function such that the straight portion forms a right angle with the substrate. Moreover, connection structures 304a and 304b also form a right angle with, respectively, the crests of the concave sides of flexible support structures 306a and 306b. Such arrangements can also improve the strength of connection between the connection structure and the support structure.

Besides the arc shape, flexible support structures 306a and 306b can also include other kinds of geometric shapes, such as a triangular shape. For example, as shown in the bottom diagram of FIG. 4C, flexible support structures 306a and 306b can include triangular portions 430a and 430b, in addition to straight portions 422a and 424a as well as straight portions 422b and 424b.

Besides the geometric shape, the different spring constants of each of flexible support structures 306a and 306b can be achieved based on including separable sub-structures that have different spring stiffness. The different stiffness can be due to, for example, the sub-structures being built using different materials, having different geometric dimensions, shapes, etc., to provide different resistive forces for different directions of movements. FIG. 4D illustrates an example of flexible support structures 306a and 306b each having two separate sub-structures made of different materials. As shown in FIG. 4D, flexible support structure 306a includes a first sub-structure 440a and a second sub-structure 442a, whereas flexible support structure 306b includes a first sub-structure 440b and a second sub-structure 442b. Each of the first and second sub-structures of a flexible support structure can be in the form of a plate and are separable from each other. First sub-structure and second sub-structure are made of different materials and have different degrees of spring stiffness. First sub-structures 440a and 440b have a lower spring stiffness than, respectively, second sub-structures 442a and 442b, and are connected to micro-mirror 302 via connection structures 304a and 304b. First sub-structures 440a and 440b can have a low spring stiffness to provide a relatively small resistive force to counter a movement towards micro-mirror 302, whereas second sub-structures 442a and 442b can have a high spring stiffness to provide a large resistive force to counter a movement away from micro-mirror 302.

The middle and bottom diagrams of FIG. 4D illustrate the operations of flexible support structures 306a and 306b. As shown in the middle diagram of FIG. 4D, when micro-mirror 302 rotates, it can pull and bend first sub-structures 440a and 440b away from, respectively, first sub-structures 442a and 442b, due to the low spring stiffness of the first sub-structure. For example, first sub-structure 440a can bend towards direction B, whereas first sub-structure 440b can bend towards direction A. Meanwhile, second sub-structures 442a and 442b are not affected by the rotation of micro-mirror 302 and stay at their default state (e.g., being upright).

On the other hand, as shown in the bottom diagram of FIG. 4D, when micro-mirror 302 undergoes a translational movement towards direction A, micro-mirror 302 can be pushed against second sub-structure 442a. The high spring stiffness of second sub-structure 442a can reduce the bending towards direction A as well as the translational movement of micro-mirror 302 towards direction A. Moreover, in a case where micro-mirror 302 under goes a translational movement towards direction B, micro-mirror 302 can be pushed against second sub-structure 442b. The high spring stiffness of second sub-structure 442b can reduce the bending towards direction B as well as the translational movement of micro-mirror 302 towards direction B.

Example Techniques to Reduce Moment of Inertia of Micro-Mirror

As explained above, a large moment of inertia of the micro-mirror may require the connection structures to have a large spring stiffness, which can increase the non-linearity of the required torque with respect to rotation angle. Moreover, a larger moment of inertia also requires the actuator to apply a larger torque to achieve a particular rotation angle. All these can complicate the control of the micro-mirror and increase the requirement of the actuator.

A large moment of inertia of the micro-mirror can be contributed by various factors. For example, an increase in the size of the micro-mirror, which can increase the aperture size to improve FOV/detection range, can lead to a large moment of inertia of the micro-mirror. Due to the increase in the moment of inertia, the connection structures that connect the micro-mirror to the substrate (or elastic support structures) may need to have a higher spring stiffness to improve the structural integrity of the pivot point. Without a high spring stiffness, the connection structures may break due to the repeated rotation of the micro-mirror. However, increasing the overall spring stiffness of the connection structures may increase the non-linearity of the required torque and the rotation angle of the micro-mirror, such that the torque required to rotate the micro-mirror by a large rotation angle becomes disproportionately large compared with rotating by a small rotation angle. In addition, a larger moment of inertia also increases the damping loss and requires more energy to be applied to the micro-mirror to maintain its oscillatory rotation motion.

Figure 5:
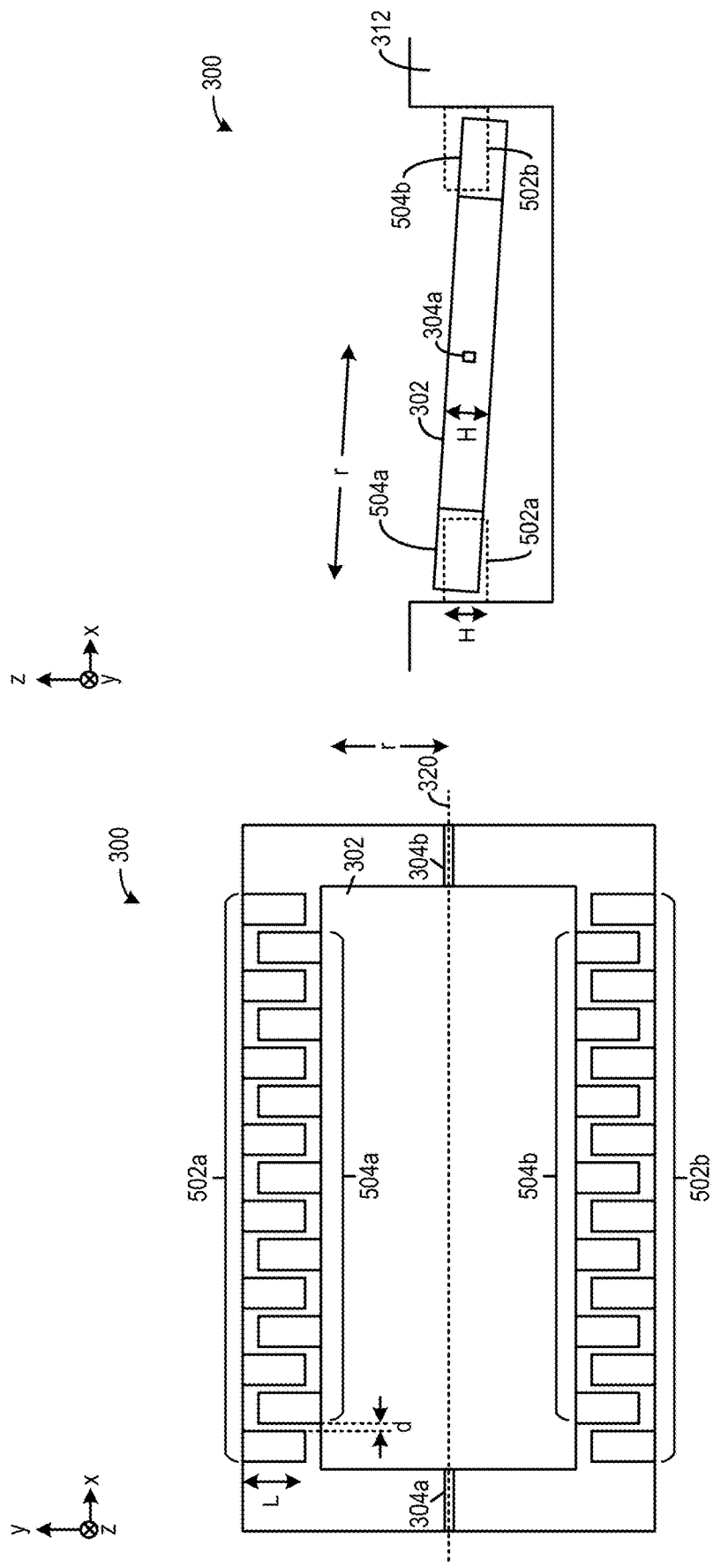
FIG. 5 illustrates an example of a micro-mirror assembly including a comb drive, according to examples of the present disclosure.

The moment of inertia of a micro-mirror can be contributed by the masses of actuator and the micro-mirror body. For example, as shown in FIG. 5, the actuator of micro-mirror assembly 300 may include a comb drive, which includes a set of static fingers 502 (e.g., static fingers 502a and 502b), as well as a set of movable fingers 504 (e.g., movable fingers 504a and 504b) mechanically connected to micro-mirror 302. Connection structures 304a and 304b can connect micro-mirror 302 directly to substrate 312 as shown in FIG. 5, or flexible support structures 306a and 306b of FIG. 3A-FIG. 4D. Static fingers 502 can be connected to substrate 312, whereas movable fingers 504 can be connected mechanically and directly to the periphery of the body of micro-mirror 302 on two opposite edges facing static fingers 502, such that static fingers 502a interleave with movable fingers 504a, whereas static fingers 502b interleave with movable fingers 504b. Movable fingers 504 can have a rotation radius r around a pivot point (at connection structures 304a and 304b). Each static finger 502 and movable finger 504 can have a length of L and a thickness of H, and the interleaving fingers can have a gap of d between them. When micro-mirror 302 is in a default orientation with zero rotation angle, the top and bottom surfaces of the fingers can be parallel with the x-y plane, whereas the side surfaces of the fingers can be parallel with the y-z plane.

The comb drive, comprising interleaving static fingers 502 and movable fingers 504, can rotate micro-mirror 302 based on generating an electrostatic force between the side surface of each pair of interleaving fingers based on a voltage difference between the interleaving fingers. For example, a first force can be generated between static fingers 502a and movable fingers 504a, whereas a second force can be generated between static fingers 502b and movable fingers 504b. The electrostatic forces can create a torque to rotate micro-mirror 302 and movable fingers 504 around the pivot point and out of the plane of the static fingers 502 (e.g., the x-y plane). The electrostatic force F can be expressed by the following Equation:

$$F = \frac{1}{2} \times \epsilon_0 \times \epsilon_r \times \frac{L}{d} \times V^2 \qquad \text{(Equation 4)}$$

In Equation 4, $\epsilon_0$ is permittivity of free space, whereas $\epsilon_r$ is permittivity of a dielectric material between the fingers (if any). In the absence of such material, $\epsilon_r$ is 1. L is the length of each interleaving finger, whereas d is the gap between a pair of interleaving fingers, as shown in FIG. 5. A pair of interleaving fingers can exert the electrostatic force against each other when the fingers remain engaged where there is overlap between the side surfaces (e.g., parallel with the y-z plane) of the fingers. When micro-mirror 302 rotates by a large angle, the fingers can become disengaged where there is no overlap between the side surfaces. In such a case, the movement of micro-mirror 302 is no longer due to the electrostatic force, but can be caused by other phenomenon, such as inertia, the resistive force exerted by connection structures 304a and 304b, gravity, etc.

The moment of inertia of a micro-mirror can be contributed by the masses of actuator and the micro-mirror body. For example, as shown in FIG. 5, as movable fingers 504 are positioned at the periphery of micro-mirror 302, they are at the furthest from the rotation axis 320 (aligned between connection structures 304a and 304b). As a result, the mass of movable fingers 504 can contribute substantially to the total moment of inertia of micro-mirror 302. In addition, in a case where the body of micro-mirror 302 comprises a plate with a uniform thickness, the mass of the micro-mirror body can become uniformly distributed within the micro-mirror body. The uniformly distributed mass, especially at positions close to the periphery of micro-mirror 302 and hence are the furthest from rotation axis 320, can also contribute substantially to the total moment of inertia of micro-mirror 302.

FIG. 6A and FIG. 6B illustrate example techniques to reduce the moment of inertia of micro-mirror 302. As shown in FIG. 6A, to reduce the moment of inertia of micro-mirror 302, the thickness of movable fingers 504 can be reduced to H' to reduce the mass of movable fingers 504 as well as their contribution to the moment of inertia of micro-mirror 302. On the other hand, given that the electrostatic force generated between the fingers is not a function of thickness, as shown in Equation 4, reducing the thickness of movable fingers 504 has negligible impact on the electrostatic force and torque generated by the comb drive. Therefore, while reducing the thickness of movable fingers 504 can reduce the moment of inertia of micro-mirror 302, which in turn reduces the required torque to achieve a particular rotation angle, the damping loss in the oscillatory rotation, as well as the required stiffness of connection structures 304 to maintain structural integrity of the pivot points, the amount of torque generated for a given voltage difference between the two sets of fingers is largely not affected by the thickness reduction. Meanwhile, the thickness of static fingers 502 can be maintained at thickness H to ensure that the interleaving pair of static fingers 502 and movable fingers 504 remain engaged over a wider range of rotation angle. In some examples, the thickness of static fingers 502 can also be reduced to match the thickness of movable fingers 504, to improve symmetricity between the electrostatic force between static fingers 502a and movable fingers 504a, and the electrostatic force between static fingers 502b and movable fingers 504b.

In addition to moment of inertia, movable fingers 504a and 504b can also contribute to substantial air damping, which leads to energy loss in the oscillatory rotation of the micro-mirror. The air damping can be caused by air friction encountered by movable fingers 504a and 504b as micro-mirror 302 rotates. Because of the damping, a torque needs to be applied at the resonant frequency to overcome the damping force to sustain the oscillatory rotation of the micro-mirror. The damping force can be a function of the dimensions of movable fingers 504a and 504b, including the thickness H. As to be shown below, the achievable rotation angle for a given torque (represented by an input voltage V) is inversely proportional to the thickness H, such that reducing the thickness H of movable fingers 504a and 504b can increase the achievable rotation angle for a given torque.

The damping force, $F_{damp}$, can be provided by the following equation:

$$F_{damp} \propto C \times \frac{dz_0}{dt} \qquad \text{(Equation 5)}$$

In Equation 5, C is the damping coefficient which is proportional to the thickness of the movable finger (thickness H as shown in FIG. 5). In addition, z is the linear displacement of finger and $z_0$ is the maximum linear displacement of the finger which is a product of the rotation radius (radius r as shown in FIG. 5) and a rotation angle $\theta_0$. The linear velocity $$\frac{dz}{dt}$$

can be related to the radius r, rotation angle $\theta_0$, and angular velocity co as follows:

$$\frac{dz_0}{dt} \propto r \times \theta_0 \times \omega \quad \text{(Equation 6)}$$

Therefore, based on Equation 6, and the fact that the damping coefficient is proportional to thickness of movable finger, damping force can be proportional to a product of the thickness H and the rotation angle $\theta_0$ as follows:

$$F_{damp} \propto H \times \theta_0^2 \quad \text{(Equation 7)}$$

The damping loss $E_{damp}$, which refers to energy lost to the damping force by the micro-mirror as the micro-mirror rotates, is proportional to a product between damping force and the linear displacement $z_0$, as follows:

$$E_{damp} \propto F_{damp} \times z_0 \quad \text{(Equation 8)}$$

As both damping force, $F_{damp}$ and linear displacement $z_0$ is a function of rotation angle $\theta_0$, damping loss $E_{damp}$ is proportional to a product between thickness H and square of rotation angle $\theta_0^2$ as follows:

$$E_{damp} \propto H \times \theta_0^2 \quad \text{(Equation 9)}$$

The input energy $E_{finger}$ provided by the torque exerted by the electrostatic force between the movable fingers and the static fingers need to compensate the damping loss $E_{damp}$ to sustain the oscillatory rotation. The input energy provided by the torque is proportional to a product of the rotation angle $\theta_0$ and square of input voltage $V^2$, as shown above in Equation 4. By equating the input energy and damping loss below, it can be seen that the rotation angle $\theta_0$ is proportional to the square of input voltage $V^2$ but inversely proportional to thickness H, as follows:

$$E_{damping} = H \times \theta_0^2 = E_{finger} = \theta_0 V^2 \quad \text{(Equation 10)}$$

Equation 10 can be rewritten as follows, indicating that the rotation angle $\theta_0$ is proportional to the square of input voltage $V^2$ but inversely proportional to thickness H:

$$\theta_0 \propto \frac{V^2}{H} \quad \text{(Equation 11)}$$

FIG. 6B illustrates another example of techniques to reduce the moment of inertia of micro mirror 302. As shown in FIG. 6B, instead of having micro-mirror 302 formed as a plate having a uniform thickness, a network of ridge structures, such as ridge structure 512 and 514, can be formed on a back side 522 of the micro-mirror body. The ridge structures can intersect to form empty compartments, such as compartments 524a, 524b, etc. Moreover, front side 526 of the micro-mirror body provides a smooth reflective surface. The network of ridge structures can reduce the total mass of the micro-mirror, hence reducing the overall moment of inertia of the micro-mirror. In addition, the network of ridge structures can improve the rigidity of the micro-mirror body.

Example Techniques to Reduce Out-of-Plane Rotation of a Comb Drive

Besides reducing the moment of inertia of micro-mirror 302, additional techniques are disclosed to improve the control of the micro-mirror 302, such as by reducing the range of out-of-plane rotation of movable fingers 504 with respect to static fingers 502. Reducing the range of out-of-plane rotation of movable fingers 504 can have numerous advantages. Specifically, the required maximum torque to rotate movable fingers 504 can be reduced. Moreover, the deformation of connection structures 304 can also be reduced, which allows connection structures 304 to have a lower spring stiffness (e.g., with a smaller width w as shown in FIG. 2C) to maintain the structural integrity of the pivot points. Further, reducing the rotation angle of movable fingers 504 can also increase the engagement between movable fingers 504 and static fingers 502 during rotation, such that micro-mirror 302 can be under the control of the electrostatic force between the two sets of fingers more often during the rotation. All these can improve the control of micro-mirror 302. On the other hand, in a case where movable fingers 504 are directly connected to micro-mirror 302, limiting the rotation of movable fingers 504 can also limit the rotation of micro-mirror 302, which is undesirable as the FOV can be reduced as a result.

To reconcile the conflicting requirements imposed on the rotation angle of micro-mirror 302, micro-mirror 302 can be rotated via an indirect scheme. FIG. 7A and FIG. 7B illustrate examples of the indirect scheme, in which movable fingers 504 are mechanically connected to micro-mirror 302 via another structure(s), such as one or more frames that surround micro-mirror 302. As shown in FIG. 7A, micro-mirror assembly 300 includes a frame 702 that surrounds micro-mirror 302. Frame 702 can be configured as a gimbal, in which first pair of connection structures 304a and 304b can connect between substrate 312 (or flexible support structures of FIG. 3A-FIG. 4B) and frame 702 at a first set of pivot points, whereas a second pair of connection structures 704a and 704b can connect between frame 702 and micro-mirror 302 at a second set of pivot points. Connection structures 304a, 304b, 704a, and 704b are elastic and have certain degrees of spring stiffness. Connection structures 304a and 304b, as well as connection structures 704a and 704b, can align along rotation axis 320. As shown in the right diagram of FIG. 7A, frame 702 can rotate around rotation axis 320 with respect to substrate 312, whereas micro-mirror 302 can rotate around rotation axis 320 with respect to frame 702 and substrate 312. Frame 702 and connection structures 704a-b can be made of the same material as micro-mirror 302 (e.g., silicon).

In addition, movable fingers 504 (504a and 504b), as part of the comb drive, can be positioned on the periphery of frame 702 instead of micro-mirror 302, and can have a smaller thickness than frame 702 to reduce the moment of inertia of the frame. The comb drive can rotate frame 702 via the electrostatic force between movable fingers 504 and static fingers 502, and frame 702 can then rotate micro-mirror 302 via connections structures 704a and 704b. Due to the elasticity of connection structures 704a and 704b, frame 702 and micro-mirror 302 can operate according to a mechanical amplification scheme in which when frame 702 rotates by a first angle $\theta_1$, the micro-mirror rotates by a second angle $\theta_2$ that is an amplification of first angle $\theta_1$, but with a different phase. The amplification M of the rotation angle from frame 702 and micro-mirror 302 can be based on the spring constants of connection structures 304a-b, connection structures 704a-b, the moments of inertia of frame 702 and micro-mirror 302, according to the following equation:

$$M(\omega) = \left| \frac{\Theta_I(\omega)}{\Theta_o(\omega)} \right| \frac{k_I}{\sqrt{(k_I - J_I s\omega^2)^2 + (b_I \omega)^2}} \quad \text{(Equation 11)}$$

In Equation 11, $\Theta_O$ and $\Theta_I$ are Laplace transforms of, respectively, rotation angle of an outer frame (e.g., frame 702) and rotation angle of an inner frame (e.g., frame 712). The following table lists the meaning of the rest of the parameters in Equation 11:

TABLE 1

| Parameter | Meaning |
| --- | --- |
| $J_I$ | moment of inertia of inner frame |
| $J_O$ | moment of inertial of outer frame |
| $k_I$ | spring constant of inner frame |
| $k_O$ | spring constant of outer frame |
| $b_I$ | damping coefficient of inner frame |
| $b_O$ | damping coefficient of outer frame |
| T | applied external torque |

The Laplace transforms $\Theta_O$ and $\Theta_I$ can be represented by the following equations:

$$\frac{\Theta_o(s)}{T} = \frac{J_I s^2 + b_I s + k_I}{\left((J_o s^2 + b_o s + k_I + k_o)(J_I s^2 + b_I s + k_I) - k_I^2\right)} \quad \text{(Equation 12)}$$

$$\frac{\Theta_I(s)}{T} = \frac{k_I}{\left((J_o s^2 + b_o s + k_I + k_o)(J_I s^2 + b_I s + k_I) - k_1^2\right)} \quad \text{(Equation 13)}$$

In Equations 12 and 13, s equals jω with ω equals to the angular frequency. There are two possible frequency (ω) which can achieve large amplification and large angle at the same time: the in-phase angular frequency ($\omega_{IP}$) that the inner and outer frame are in phase, and the out-of-phase angular frequency ($\omega_{OP}$) that the inner and outer frame are out of phase. The in-phase angular frequency $\omega_{IP}$ and out-of-phase angular frequency $\omega_{OP}$ can be defined based on the parameters listed in Table 1 and according to the following equations:

$$\omega_{IP}^2 = \quad \text{(Equation 14)}$$

$$\frac{k_I}{2J_o} + \frac{\omega_o^2}{2} + \frac{\omega_I^2}{2} - \frac{\sqrt{-4k_I k_o J_I J_o + (k_o J_I + k_I J_I + k_I J_o)^2}}{2 J_I J_o}$$

$$\omega_{OP}^2 = \quad \text{(Equation 15)}$$

$$\frac{k_I}{2J_o} + \frac{\omega_o^2}{2} + \frac{\omega_I^2}{2} + \frac{\sqrt{-4k_I k_o J_I J_o + (k_o J_I + k_I J_I + k_I J_o)^2}}{2 J_I J_o}$$

In Equations 14 and 15, $\omega_I$ is the angular frequency of the inner frame and can be defined based on the following equation:

$$\omega_I = \sqrt{\frac{k_I}{J_I}} \quad \text{(Equation 16)}$$

Moreover, in Equations 14 and 15, $\omega_O$ is the angular frequency of the outer frame and can be defined based on the following equation:

$$\omega_o \sqrt{\frac{k_o}{J_o}} \quad \text{(Equation 17)}$$

As a result of the mechanical amplification, the range of rotation of frame 702 can be reduced, while the range of rotation of micro-mirror 302 can be maintained. This can improve the engagement between static fingers 502 and movable fingers 504 and the control of micro-mirror 302, while allowing the spring stiffness of connection structures 304a-b to be reduced. Meanwhile, the moment of inertia of micro-mirror 302 can also be reduced due to the removal of movable fingers 504, and can be further reduced by forming a network of ridges at the back side as shown in FIG. 6B, to reduce the required spring stiffness of connection structures 704a-b. The network of ridges can also improve the stiffness of the entire micro-mirror structure. The improved stiffness can reduce the deformation of micro-mirror 302, which could otherwise introduce non-uniformity in the direction of reflection of light at different spots of micro-mirror 302.

FIG. 7B and FIG. 7C illustrate other examples of micro-mirror assembly 300. As shown in FIG. 7B, in addition to frame 702 which is configured as an outer frame, micro-mirror assembly 300 further includes an inner frame 712 that surrounds micro-mirror 302. Inner frame 712 can surround and connect with micro-mirror 302 via connection structures 722a, 722b, 722c, and 722d. Inner frame 712 is surrounded by outer frame 702, and is connected to outer frame 702 via connection structures 704a and 704b. As in FIG. 7A, movable fingers 504 are connected to the periphery of outer frame 702. The electrostatic force between static fingers 502 and movable fingers 504 can cause outer frame 702 to rotate around rotation axis 320 with respect to substrate 312. Due to the elasticity of connection structures 704a and 704b, inner frame 712 and micro-mirror 302 together can rotate around rotation axis 320 with respect to outer frame 702 and substrate 312. Inner frame 712 and connection structures 722a-d can also be made of silicon. FIG. 7C illustrates another example of FIG. 7B where in addition to micro-mirror 302, outer frame 702, and inner frame 712, micro-mirror assembly 300 further includes flexible support structures 306a and 306b as well as rigid support structures 332a-b and 334a-b of FIG. 3A.

Inner frame 712 can shield micro-mirror 302 from the shear deformation of connection structures 704a and 704b to reduce the deformation of micro-mirror 302, which could otherwise introduce non-uniformity in the direction of reflection of light at different spots of micro-mirror 302. With the arrangements of FIG. 7B, the precision of the scanning operation can be improved.

Example Techniques to Fabricate a Micro-Mirror Assembly

Figure 8A:
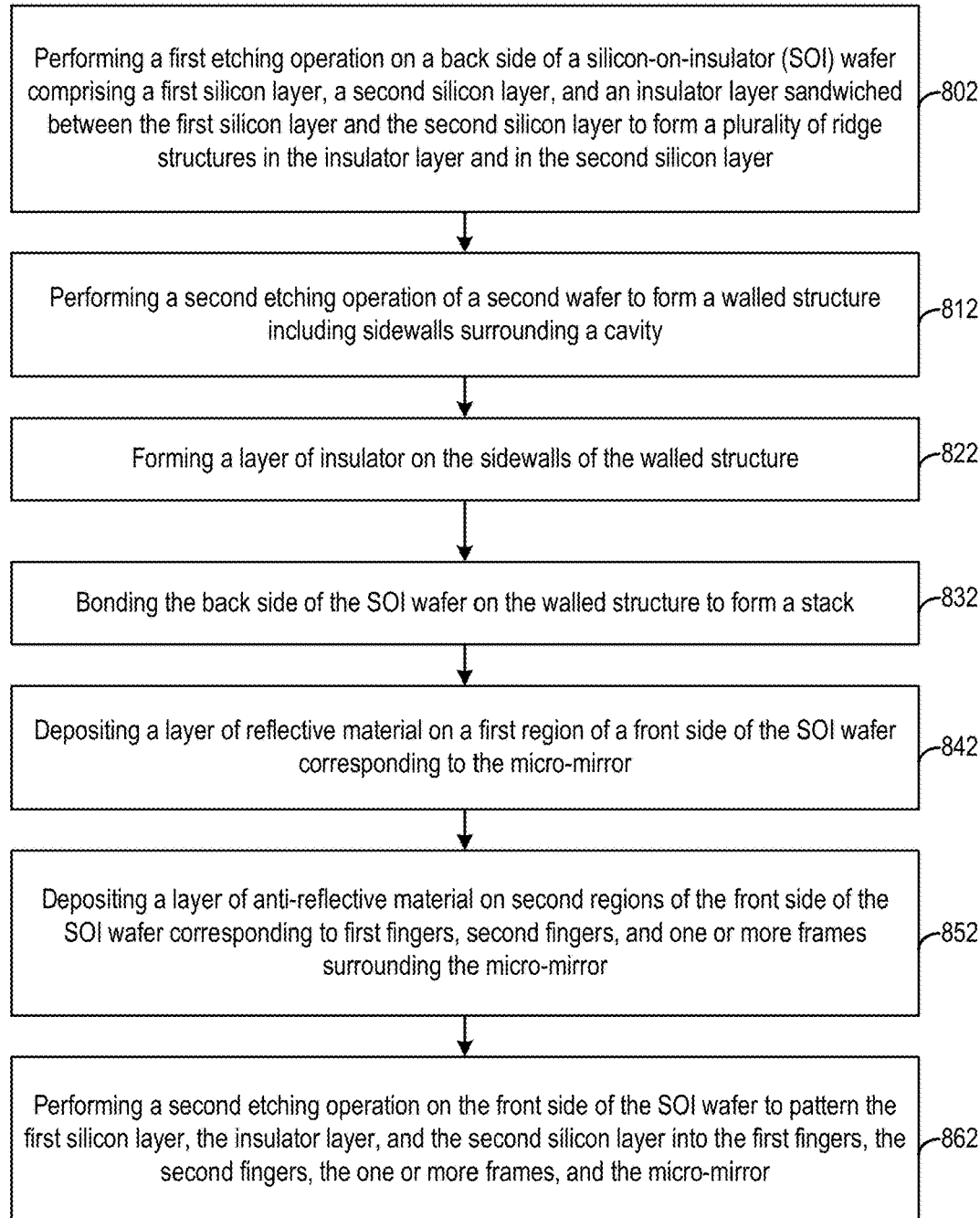
FIG. 8A, FIG. 8B, and FIG. 8C illustrate a method of fabricating the example micro-mirror assembly of FIG. 6A-FIG. 7B, according to examples of the present disclosure.
Figure 8B:
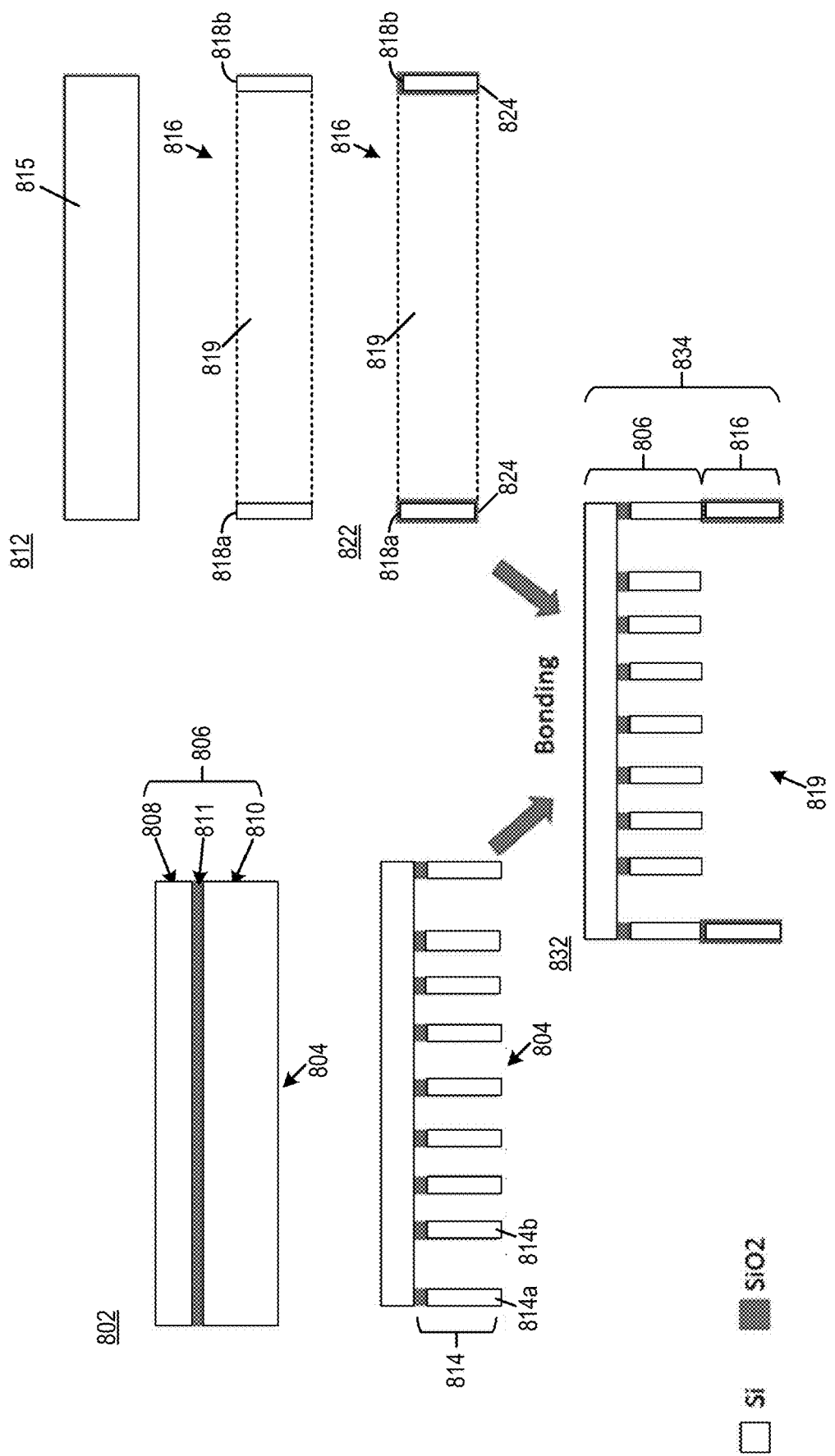
Figure 8C:
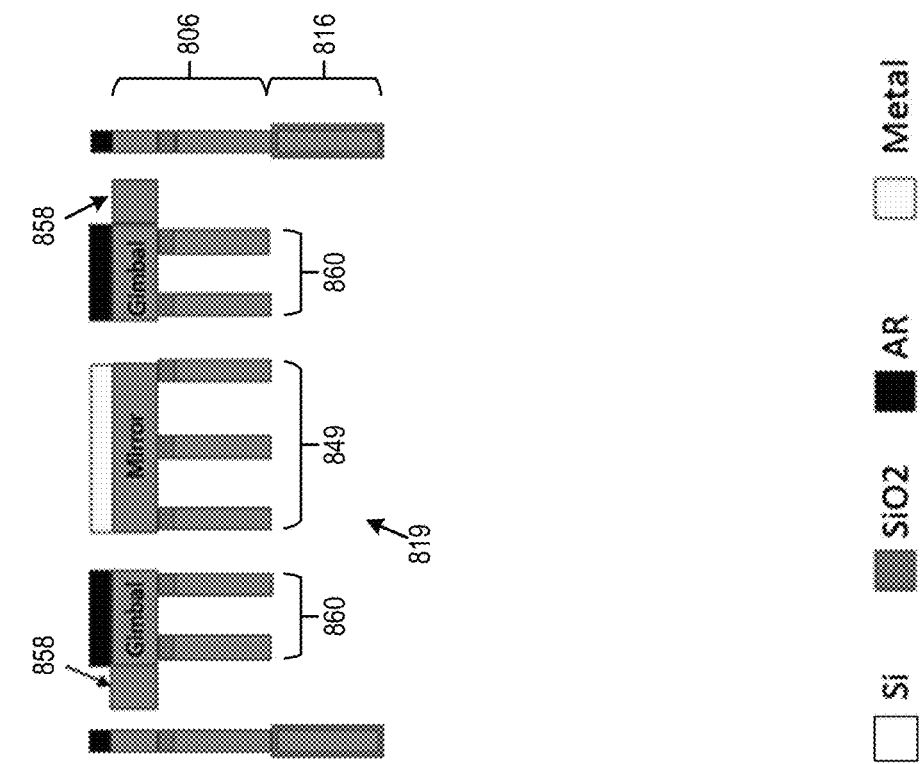
Figure 8C:
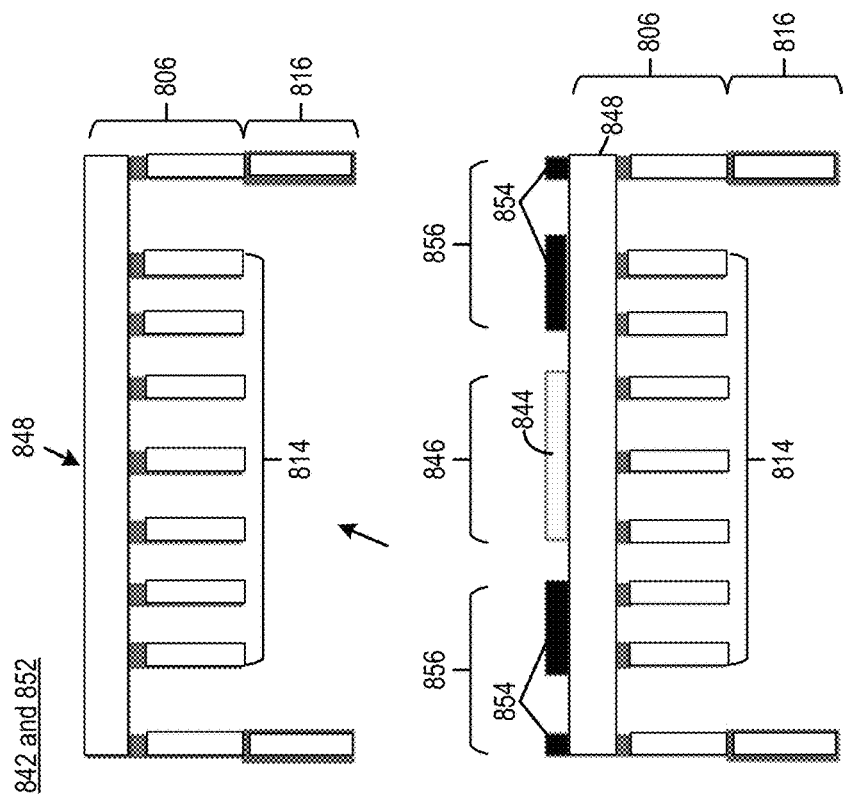

FIG. 8A, FIG. 8B, and FIG. 8C illustrate an example method 800 of fabricating micro-mirror assembly 300, such as micro-mirror assembly 300 of FIG. 6A-FIG. 7B. FIG. 8A illustrates a flowchart of method 800, whereas FIG. 8B and FIG. 8C illustrate a cross-section of devices involved in each step of method 800 the fabrication operation.

Referring to FIG. 8A and FIG. 8B, method 800 starts with step 802, in which a first etching operation is performed on a back side 804 of a silicon-on-insulator (SOI) wafer 806. Referring to FIG. 8B, SOI wafer 806 comprises a first silicon layer 808, a second silicon layer 810, and an insulator layer 811 (e.g., Silicon Dioxide $SiO_2$) sandwiched between first silicon layer 808 and second silicon layer 810. The first etching operation can be performed on the back side 804 of SOI wafer 806 to form a plurality of ridge structures 814

(e.g., ridge structures 814a, 814b, etc.) in insulator layer 811 and in second silicon layer 810. The ridge structures 814 can correspond to ridge structures 512 and 514 of FIG. 6B.

In step 812, a second etching operation is performed on a second wafer 815. Referring to FIG. 8B, second wafer 815 can include a single silicon layer. A through-wafer etching operation can be performed to etch through second wafer 815 to form a walled structure 816 including sidewalls 818 (e.g., side walls 818a, 818b, etc.) and cavity 819.

In step 822, a layer of insulator 824 (e.g., $SiO_2$) can be formed on sidewalls 818 of walled structure 816. The formation of insulator 824 can be based on, for example, thermal oxidation to merge the insulator layer on sidewalls 818 to ridge structures 814 of SOI wafer 806.

In step 832, the back side of SOI wafer 806 can be bonded to walled structure 816 to form a stack 834. As to be described below, a rotatable micro-mirror is to be formed from SOI wafer 806, and cavity 819 below SOI wafer 806 provides space for the micro-mirror to rotate. The bonding can be performed based on, for example, thermal bonding.

Referring to FIG. 8C, in step 842, a layer of reflective material 844 (e.g., a metallic material) can be deposited on a first region 846 of a front side 848 of SOI wafer 806. First region 846 can correspond to a micro-mirror 847 (e.g., micro-mirror 302). Moreover, in step 852, a layer of anti-reflective material 854 (e.g., Silicon Nitride) can be deposited on second regions 856 of front side 848 of SOI wafer 806. The second regions can correspond to first fingers and second fingers 858 (e.g., fixed fingers 502 and movable fingers 504 of FIG. 6A), and one or more frames 860 that surround the micro-mirror (e.g., outer frame 702, inner frame 704, etc.).

In step 862, a second etching operation can be performed on front side 848 of SOI wafer 806 to pattern the first silicon layer, the insulator layer, and the second silicon layer into first and second fingers 858, one or more frames 860, and micro-mirror 849. Cavity 819 below micro-mirror 849, enclosed by sidewalls 818, can provide a free space for the rotation of micro-mirror 849.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. An apparatus, the apparatus being part of a Light Detection and Ranging (LiDAR) module of a vehicle and comprising:
    a semiconductor integrated circuit comprising a microelectromechanical system (MEMS) and a substrate, the MEMS comprising an array of micro-mirror assemblies, each micro-mirror assembly comprising:
        a micro-mirror having a first thickness; and
        an actuator comprising first fingers and second fingers, the first fingers being directly connected with the substrate, the second fingers being mechanically connected to the micro-mirror having a second thickness smaller than the first thickness, the actuator being configured to generate an electrostatic force between the first fingers and the second fingers to rotate the micro-mirror to reflect light emitted by a light source out of the LiDAR module or light received by the LiDAR module to a receiver,
    wherein the second fingers are mechanically connected to the micro-mirror via a plurality of frames that surround the micro-mirror including a first frame and a second frame,
    wherein the second fingers are formed along two opposite edges of the first frame and interleave with the first fingers,
    wherein the first frame is connected to the substrate via a first pair of connection structures aligned with a rotation axis, the first frame being rotatable around the rotation axis relative to the substrate, the first pair of connection structures being connected to the substrate and the first frame at first pivot points aligned with the rotation axis and being elastic, the first pair of connection structures being deformable to accommodate the rotation of the first frame with respect to the substrate,
    wherein the first frame is connected to the micro-mirror via a second pair of connection structures aligned along the rotation axis, the micro-mirror rotatable around the rotation axis relative to the first frame and relative to the substrate, the second pair of connection structures being connected to the first frame and the micro-mirror at second pivot points aligned with the rotation axis and being elastic and deformable to accommodate the rotation of the micro-mirror with respect to the first frame,
    wherein the first frame surrounds the second frame and the second frame surrounds the micro-mirror,
    wherein the first frame is connected to the second frame via the second pair of connection structures,
    wherein the second frame and the micro-mirror is connected via third connection structures, and
    wherein the second frame and the micro-mirror rotate together relative to the first frame.

2. The apparatus of claim 1, wherein the second fingers are mechanically and directly connected to the micro-mirror and formed along two opposite edges of the micro-mirror and interleave with the first fingers.

3. The apparatus of claim 1, wherein the first pair of connection structures and the second pair of connection structures comprise at least one of: a spring or a torsion bar.

4. The apparatus of claim 1, wherein when the first frame rotates by a first angle relative to the substrate, the micro-mirror rotates by a second angle relative to the substrate, a magnitude of the second angle being larger than the first angle.

5. The apparatus of claim 4, wherein a ratio between the second angle and the first angle is pre-determined based on a first degree of stiffness of the first pair of connection structures, a second degree of stiffness of the second pair of connection structures, a first moment of inertia of the first frame, and a second moment of inertia of the micro-mirror.

6. The apparatus of claim 1, wherein the micro-mirror comprises a first side and a second side opposite to the first side;
wherein the first side comprises a light reflecting surface; and
wherein the second side comprises a plurality of ridge structures, the plurality of ridge structures having the first thickness and configured to increase a stiffness of the micro-mirror.

7. The apparatus of claim 6, wherein the plurality of ridge structures intersect and form compartments on the second side of the micro-mirror.

8. The apparatus of claim 6, wherein the substrate comprises a first silicon layer, a second silicon layer, and an insulator layer sandwiched between the first silicon layer and the second silicon layer;
wherein the micro-mirror, the first fingers, and the second fingers are formed in the first silicon layer; and
wherein the plurality of ridge structures are formed in the second silicon layer.

9. The apparatus of claim 1, wherein the light source is a laser source.

10. The apparatus of claim 1, further comprising a controller configured to control the actuator of each micro-mirror assembly of the array of micro-mirror assemblies to rotate the micro-mirror of the respective micro-mirror assembly to set one of: an input path of light to the receiver, or an output projection path of light from the light source.

11. The apparatus of claim 10,
wherein the light source is a pulsed light source; and
wherein the controller is configured to:
control the light source to generate a first light pulse at a first time;
control the actuator to set a first angle of the output projection path to project the first light pulse towards an object along the output projection path;
control the actuator to set a second angle of the input path to steer a second light pulse reflected from the object to the receiver, the second light pulse being received at the receiver at a second time; and
determine a location of the object with respect to the apparatus based on a difference between the first time and the second time, the first angle, and the second angle.

* * * * *